(12) United States Patent
Joo et al.

(10) Patent No.: US 12,040,043 B2
(45) Date of Patent: Jul. 16, 2024

(54) SEMICONDUCTOR MEMORY DEVICE WITH OPERATION LIMIT CONTROLLER

(71) Applicant: SAMSUNG ELECTRONICS CO., LTD., Suwon-si (KR)

(72) Inventors: Seonghoon Joo, Hwaseong-si (KR); Jaejun Lee, Seongnam-si (KR); Ilhan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 163 days.

(21) Appl. No.: 17/720,843

(22) Filed: Apr. 14, 2022

(65) Prior Publication Data

US 2023/0083475 A1    Mar. 16, 2023

(30) Foreign Application Priority Data

Sep. 13, 2021  (KR) .......................... 10-2021-0121736

(51) Int. Cl.
| | |
|---|---|
| *G11C 11/06* | (2006.01) |
| *G06F 1/20* | (2006.01) |
| *G11C 7/04* | (2006.01) |

(52) U.S. Cl.
CPC .............. *G11C 7/04* (2013.01); *G06F 1/206* (2013.01); *G11C 2207/2227* (2013.01)

(58) Field of Classification Search
CPC .............. G11C 7/04; G11C 2207/2227; G11C 2029/0411; G11C 2029/5002; G11C 29/50; G11C 29/04; G06F 1/206; G06F 1/3225; G06F 1/3275; Y02D 10/00

USPC .......................................................... 365/244
See application file for complete search history.

(56) References Cited

U.S. PATENT DOCUMENTS

| | | | |
|---|---|---|---|
| 7,075,847 B2 * | 7/2006 | Kim ...................... | G11C 11/406 |
| | | | 327/512 |
| 7,272,063 B1 | 9/2007 | Egerer et al. | |
| 8,174,921 B2 | 5/2012 | Kim et al. | |
| 9,324,408 B2 | 4/2016 | Rim et al. | |
| 11,416,174 B2 * | 8/2022 | Kwon ...................... | G11C 7/04 |
| 2010/0110786 A1 | 5/2010 | Kang et al. | |
| 2014/0032949 A1 * | 1/2014 | Kim .................. | G05D 23/1919 |
| | | | 713/322 |

(Continued)

*Primary Examiner* — Tha-O H Bui
(74) *Attorney, Agent, or Firm* — Sughrue Mion, PLLC

(57) ABSTRACT

A semiconductor memory device includes a plurality of input-output pins configured to communicate with a memory controller, a command control logic, a temperature measurement circuit and an operation limit controller. The command control logic controls an operation of the semiconductor memory device based on command signals and control signals transferred from the memory controller through control pins among the plurality of input-output pins. The temperature measurement circuit measures an operation temperature of the semiconductor memory device to generate a temperature code corresponding to the operation temperature. The operation limit controller, when it is determined based on the temperature code that the operation temperature exceeds a risk temperature, controls an internal operation of the semiconductor memory device regardless of the command signals and the control signals transferred from the memory controller to thereby decrease a power consumption of the semiconductor memory device.

20 Claims, 22 Drawing Sheets

(56) References Cited

U.S. PATENT DOCUMENTS

2021/0082478 A1  3/2021  Cho et al.
2021/0157526 A1  5/2021  Kwon

* cited by examiner

| CMD | CK | R0 | R1 | R2 | R3 |
|---|---|---|---|---|---|
| PDE | EGr | L | H | L | H |
| | EGf | L | H | L | H |
| PDX | EGr | H | H | H | H |

| CMD | CS_n | CA PINS ||||| 
|---|---|---|---|---|---|---|
|  |  | CA0 | CA1 | CA2 | CA3 | CA4 |
| PDE | L | H | H | H | L | H |
| PDX | L | H | H | H | H | H |

SEMICONDUCTOR MEMORY DEVICE WITH OPERATION LIMIT CONTROLLER

CROSS-REFERENCE TO RELATED APPLICATION

This application claims priority under 35 U.S.C. § 119 to Korean Patent Application No. 10-2021-0121736, filed on Sep. 13, 2021, in the Korean Intellectual Property Office, the disclosure of which is incorporated by reference herein in its entirety.

BACKGROUND

1. Technical Field

Example embodiments relate generally to semiconductor integrated circuits, and more particularly to semiconductor memory device, a memory system including a semiconductor memory device and method of controlling a semiconductor memory device.

2. Discussion of Related Art

When an operation temperature of a semiconductor memory device increases excessively, physical damage occurs and the damaged semiconductor memory device becomes unusable. In general, temperature throttling may be performed as a system level to adjust the operation temperature of the semiconductor memory device. However, the temperature throttling is based on a temperature sensor such as a TSOD (Temperature Sensor On DIMM (Dual In-ling Memory Module)) that is disposed outside the semiconductor memory device, which cannot reflect the exact temperature of the semiconductor memory device. In addition, configuration of a memory system may become complex and the performance may be degraded if an internal temperature of the semiconductor memory device is provided to a memory controller for the temperature throttling.

SUMMARY

Some example embodiments provide a semiconductor memory device, a memory system, and associated methods, which may be capable of efficiently preventing physical damage of the semiconductor memory device due to high temperature.

According to an aspect of example embodiments, a semiconductor memory device includes a plurality of input-output pins configured to communicate with a memory controller, a command control logic, a temperature measurement circuit and an operation limit controller. The command control logic controls an operation of the semiconductor memory device based on command signals and control signals transferred from the memory controller through control pins among the plurality of input-output pins. The temperature measurement circuit measures an operation temperature of the semiconductor memory device to generate a temperature code corresponding to the operation temperature. The operation limit controller, when it is determined based on the temperature code that the operation temperature exceeds a risk temperature, controls an internal operation of the semiconductor memory device regardless of the command signals and the control signals transferred from the memory controller to thereby decrease a power consumption of the semiconductor memory device.

According to an aspect of example embodiments, a memory system includes a memory controller and a semiconductor memory device. The semiconductor memory device includes a plurality of input-output pins configured to communicate with the memory controller, a command control logic configured to control an operation of the semiconductor memory device based on command signals and control signals transferred from the memory controller through control pins among the plurality of input-output pins, a temperature measurement circuit configured to measure an operation temperature of the semiconductor memory device to generate a temperature code corresponding to the operation temperature, and an operation limit controller configured to, when it is determined based on the temperature code that the operation temperature exceeds a risk temperature, control an internal operation of the semiconductor memory device regardless of the command signals and the control signal transferred from the memory controller to thereby decrease a power consumption of the semiconductor memory device.

According to example embodiments, a method of controlling a semiconductor memory device, includes, generating a temperature code corresponding to an operation temperature of a semiconductor memory device by measuring the operation temperature using a temperature measurement circuit, determining, based on the temperature code, whether the operation temperature exceeds a risk temperature, and when the operation temperature exceeds the risk temperature, controlling an internal operation of the semiconductor memory device regardless of command signals and control signals transferred from a memory controller to thereby decrease a power consumption of the semiconductor memory device.

The semiconductor memory device, the memory system and the method according to example embodiments may efficiently prevent physical damage of the semiconductor memory device by controlling the internal operation of the semiconductor memory device based on the internal operation temperature of the semiconductor memory device regardless of control of the memory controller.

BRIEF DESCRIPTION OF THE DRAWINGS

The above and/or other aspects of the present disclosure will be more clearly understood from the following detailed description taken in conjunction with the accompanying drawings, in which.

DETAILED DESCRIPTION

Figure 1:
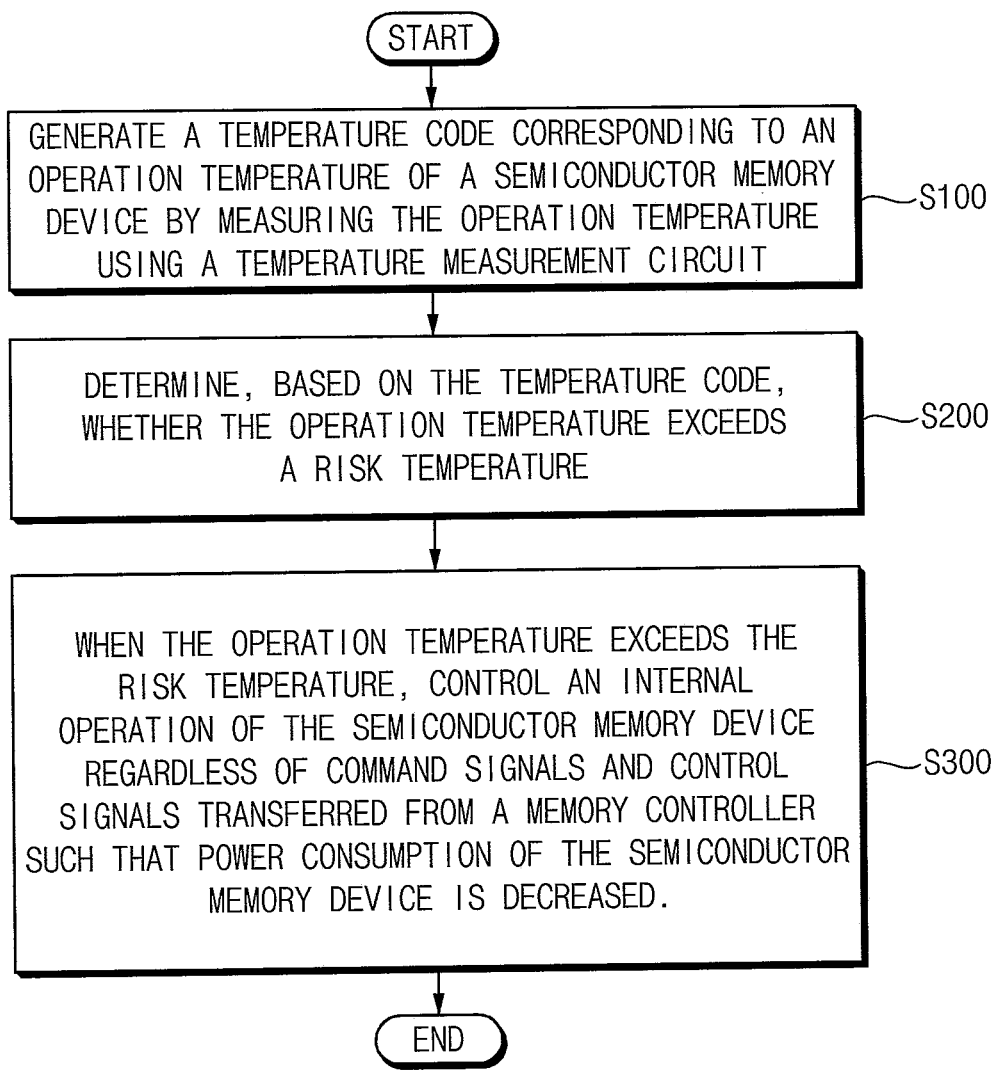
FIG. 1 is a flowchart illustrating a method of controlling a semiconductor memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

Figure 2:
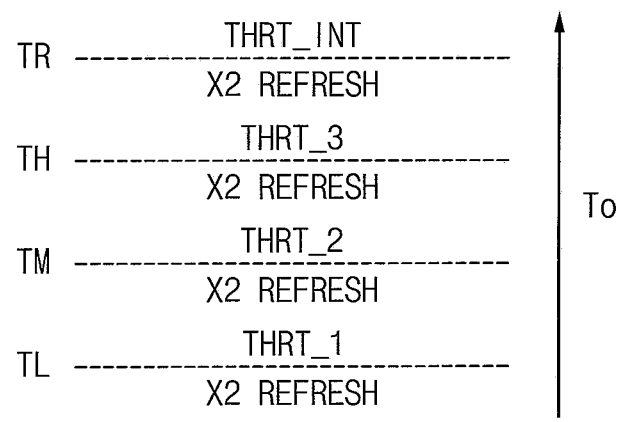
FIG. 2 is a conceptual diagram illustrating a method of controlling a semiconductor memory device according to example embodiments.

FIG. 1 is a flowchart illustrating a method of controlling a semiconductor memory device according to example embodiments, and FIG. 2 is a conceptual diagram illustrating a method of controlling a semiconductor memory device according to example embodiments.

Referring to FIG. 1, a temperature code corresponding to an operation temperature of a semiconductor memory device may be generated by measuring the operation temperature using a temperature measurement circuit (S100). The generation of the temperature code will be described below with reference to FIGS. 28 and 29.

It may be determined, based on the temperature code, whether the operation temperature exceeds a risk temperature (S200). When the operation temperature exceeds the risk temperature, an internal operation of the semiconductor memory device may be controlled regardless of command signals and control signals transferred from a memory controller such that power consumption of the semiconductor memory device is decreased (S300).

In some example embodiments, as will be described below with reference to FIGS. 10 through 19, the semiconductor memory device may be controlled to enter a power down mode regardless of power down commands transferred from the memory controller, when the operation temperature exceeds the risk temperature.

In some example embodiments, as will be described below with reference to FIGS. 20 and 21, the semiconductor memory device may be reset regardless of a reset signal transferred from the memory controller, when the operation temperature exceeds the risk temperature.

In some example embodiments, as will be described below with reference to FIG. 22, data including errors may be transferred to the memory controller regardless of read data, when the operation temperature exceeds the risk temperature.

Referring to FIG. 2, a memory controller or a host device in a memory system may perform temperature throttling based on several reference temperatures such as a low temperature TL, a middle temperature TM, a high temperature TH, and so on. A first temperature throttling level THRT_1, a second temperature throttling level THRT_2 and a third temperature throttling level THRT_3 may be applied for temperature ranged between the reference temperature TL, TM and TH. The semiconductor memory device may be controlled to lower the power consumption when the operation temperature To exceeds the reference temperatures TL, TM and TH. The reduction of the power consumption may be implemented by reducing an operation frequency of the semiconductor memory device and/or reducing a bandwidth of transferring data between the semiconductor memory device and the memory controller.

In a comparative example, a temperature throttling of a system level is performed based on information provided from an external temperature sensor such as the TSOD that cannot reflect the real operation temperature To of the semiconductor memory device.

The semiconductor memory device may perform double speed (×2) refresh operation when the operation temperature To exceeds the low temperature TL, based on information from an internal sensor. Such control of the refresh operation is not for preventing physical damage of the semiconductor memory device but for preventing data loss.

According to example embodiments, the risk temperature TR, which is higher than the reference temperatures for the temperature throttling, may be set for internal temperature throttling controlled by the semiconductor memory device itself. For example, the risk temperature TR may be set to about 100° C. When the operation temperature To exceeds the risk temperature TR, the internal operation of the semiconductor memory device may be controlled to rapidly reduce the power consumption of the semiconductor memory device, thereby reducing the operation temperature To.

As such, the semiconductor memory device, the memory system and the method according to example embodiments efficiently prevent physical damage of the semiconductor memory device by controlling the internal operation of the semiconductor memory device based on the internal operation temperature of the semiconductor memory device regardless of control of the memory controller.

Figure 3:
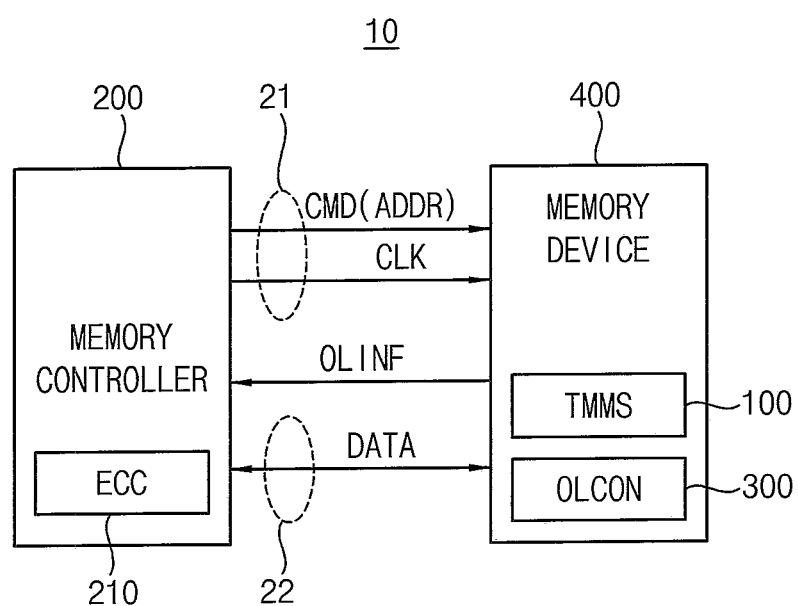
FIG. 3 is a block diagram illustrating a memory system according to example embodiments.
Figure 4:
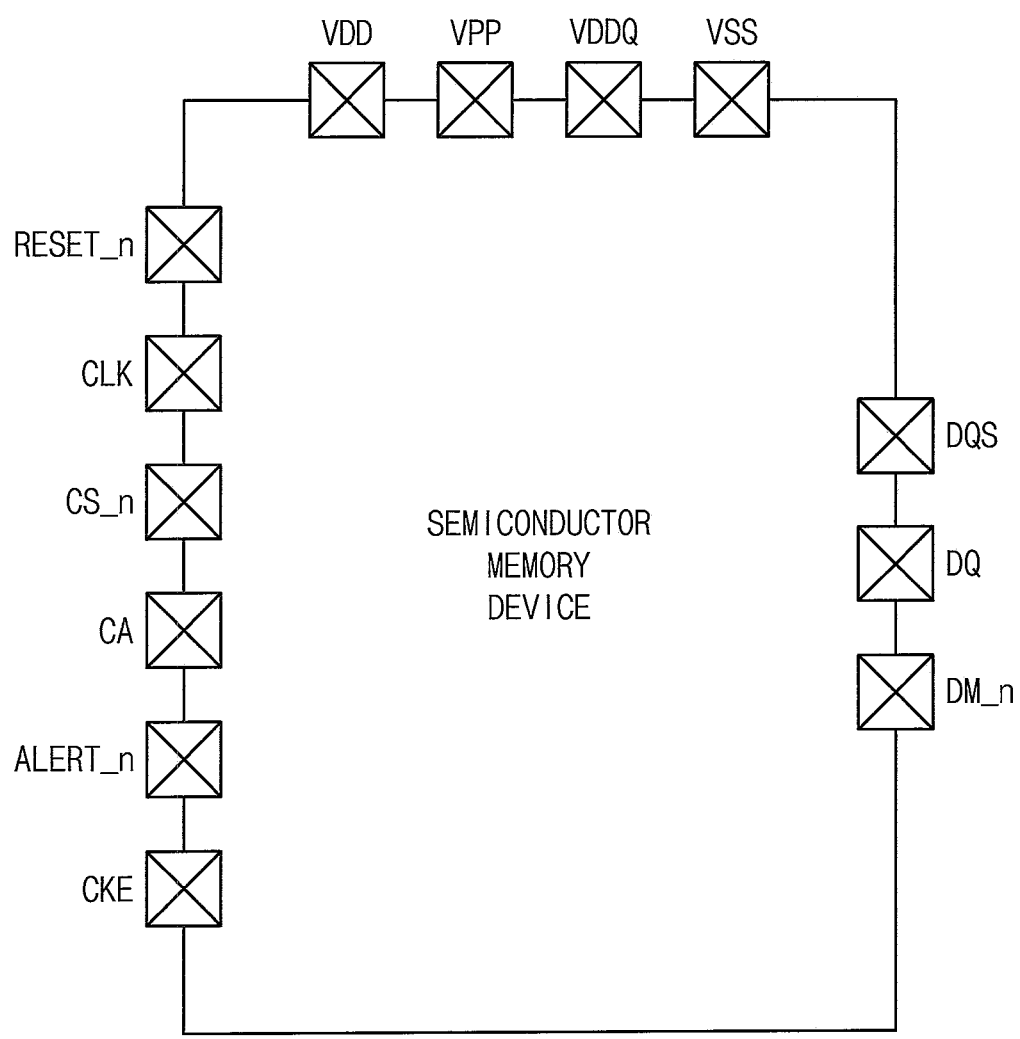
FIG. 4 is a diagram illustrating an example embodiment of input-output pins of a semiconductor memory device according to example embodiments.

FIG. 3 is a block diagram illustrating a memory system according to example embodiments. FIG. 4 is a diagram illustrating an example embodiment of input-output pins of a semiconductor memory device according to example embodiments.

Referring to FIG. 3, a memory system 10 may include a memory controller 200 and a memory device 400. The memory controller 200 and the memory device 400 may include respective interfaces for mutual communication. The interfaces may be connected through a control bus 21 for transferring a command CMD, an address ADDR, a clock signal CLK, etc., and a data bus 22 for transferring data. According to some standards for memory devices, the address ADDR may be incorporated in the command CMD. The memory controller 200 may generate the command CMD to control the memory device 400, and the data may be written to or read from the memory device 400 under the control of the memory controller 200.

The memory device 400 may include a temperature measurement circuit TMMS 100 and an operation limit controller OLCON 300. The semiconductor memory device 400 may include a plurality of input-output pins, a command control logic, and so on. The operation limit controller OLCON 300 may transfer operation limit information OLINF to the memory controller 200.

The plurality of input-output pins may be used to communicate with the memory controller 200. As illustrated in FIG. 4, the plurality of input-output pins IOP may include voltage pins to which power supply voltages VDD, VPP and VDDQ and a ground voltage VSS, control pins to receive a reset signal RESET_n, a clock signal CLK, a chip selection signal CS_n, a command-address signal CA, an alert signal ALERT_n, a clock enable signal CKE, a data strobe signal DQS, a data mask signal DM_n, etc., and data pins DQ to receive or transmit data. FIG. 4 illustrates an example pin layout, and configuration, number and layout of the input-output pins may be determined variously depending on the kind of the semiconductor memory device 400.

As will be described below with reference to FIG. 5, the command control logic may control an operation of the semiconductor memory device 400 based on command signals and control signals transferred from the memory controller 200 through control pins among the plurality of input-output pins.

As will be described below with reference to FIGS. 28 and 29, the temperature measurement circuit 100 may measure an operation temperature To of the semiconductor memory device 400 to generate a temperature code TCODE corresponding to the operation temperature To. The temperature measurement circuit 100 may include an on-chip temperature sensor that is disposed in a semiconductor die of the semiconductor memory device 400. The real operation temperature To of the semiconductor memory device 400 may be reflected accurately using the on-chip temperature sensor.

The operation limit controller 300 may, when it is determined based on the temperature code TCODE that the operation temperature To exceeds a risk temperature TR, control an internal operation of the semiconductor memory device 400 regardless of the command signals and the control signals transferred from the memory controller 200 such that power consumption of the semiconductor memory device 400 may be decreased. The control of the internal operation by the operation limit controller 300 will be further described below with reference to FIGS. 6 through 22.

The memory controller 200 may include an ECC (Error Check Code) engine 210. The ECC engine 210 may encode data to provide write data to the semiconductor memory device 400, and decode data from the semiconductor memory device 400 to check and correct errors in the received data. When the errors in the data cannot be corrected, the memory controller 200 may proper steps such as resetting of the semiconductor memory device 400.

Figure 5:
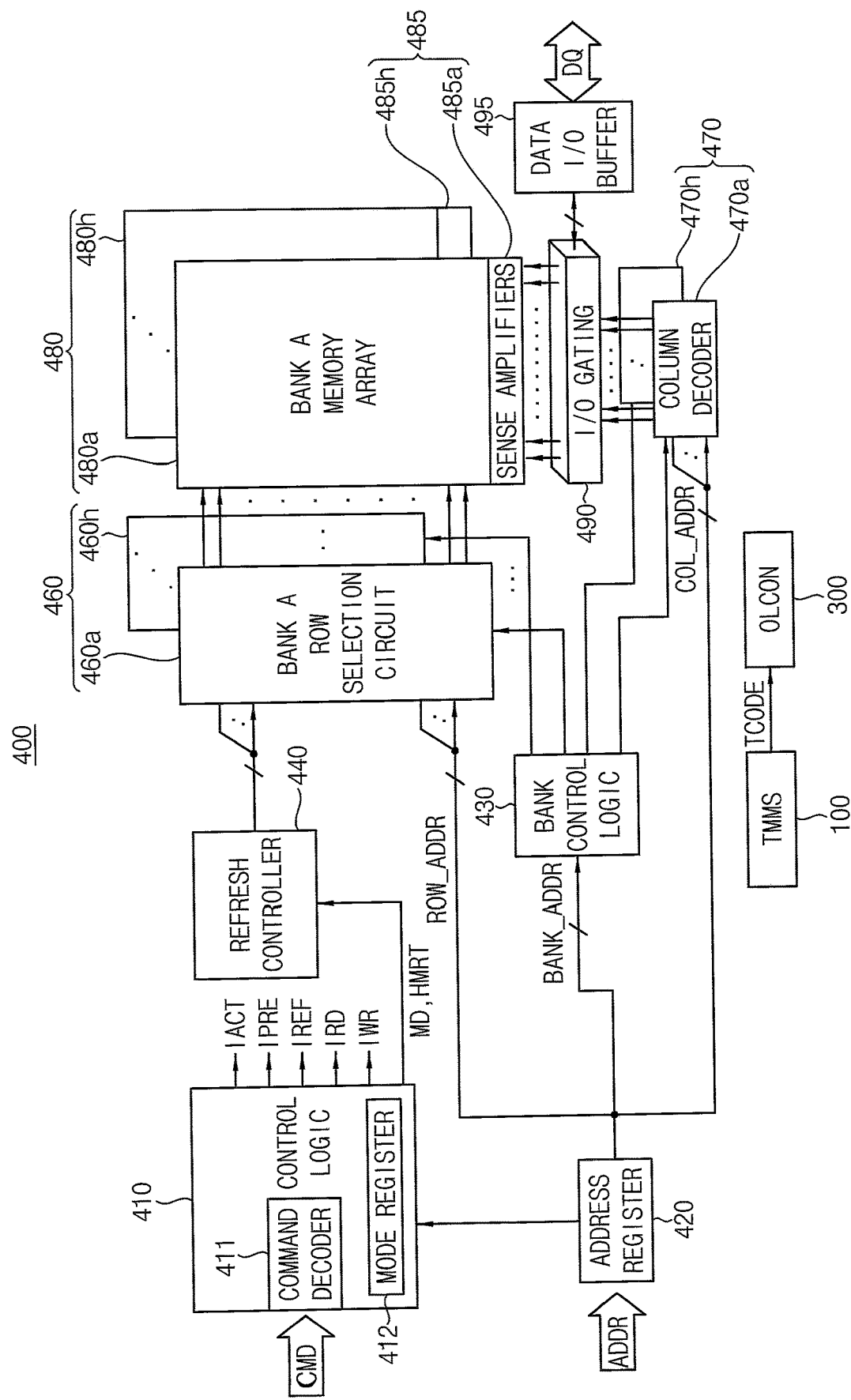
FIG. 5 is a block diagram illustrating a semiconductor memory device according to example embodiments.

FIG. 5 is a block diagram illustrating a semiconductor memory device according to example embodiments.

Referring to FIG. 5, a memory device 400 may include a command control logic 410, an address register 420, a bank control logic 430, a row selection circuit 460 (or row decoder), a column decoder 470, a memory cell array 480, a sense amplifier unit 485, an input/output (I/O) gating circuit 490, a data input/output (I/O) buffer 495, refresh controller 440, a temperature measurement circuit TMMS 100 and an operation limit controller OLCON 300.

The memory cell array 480 may include a plurality of bank arrays 480a, . . . , 480h. The row selection circuit 460 may include a plurality of bank row selection circuits 460a, . . . , 460h respectively coupled to the bank arrays 480a, . . . , 480h. The column decoder 470 may include a plurality of bank column decoders 470a, . . . , 470h respectively coupled to the bank arrays 480a, . . . , 480h. The sense amplifier unit 485 may include a plurality of bank sense amplifiers 485a, . . . , 485h respectively coupled to the bank arrays 480a, . . . , 480h.

The address register 420 may receive an address ADDR including a bank address BANK_ADDR, a row address ROW_ADDR, and a column address COL_ADDR from the memory controller 200. The address register 420 may provide the received bank address BANK_ADDR to the bank control logic 430, may provide the received row address ROW_ADDR to the row selection circuit 460, and may provide the received column address COL_ADDR to the column decoder 470.

The bank control logic 430 may generate bank control signals in response to the bank address BANK_ADDR. One of the bank row selection circuits 460a, . . . , 460h corresponding to the bank address BANK_ADDR may be activated in response to the bank control signals, and one of the bank column decoders 470a, . . . , 470h corresponding to the bank address BANK_ADDR may be activated in response to the bank control signals.

The row address ROW_ADDR from the address register 420 may be applied to the bank row selection circuits 460a, . . . , 460h. The activated one of the bank row selection circuits 460a, . . . , 460h may decode the row address ROW_ADDR, and may activate a wordline corresponding to the row address ROW_ADDR. For example, the activated bank row selection circuit 460 may apply a wordline driving voltage to the wordline corresponding to the row address ROW_ADDR.

The column decoder 470 may include a column address latch. The column address latch may receive the column address COL_ADDR from the address register 420, and may temporarily store the received column address COL_ADDR. In some example embodiments, in a burst mode, the column address latch may generate column addresses that increment from the received column address COL_ADDR. The column address latch may apply the temporarily stored or generated column address to the bank column decoders 470a, . . . , 470h.

The activated one of the bank column decoders 470a, ..., 470h may decode the column address COL_ADDR, and may control the I/O gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a, ..., 480h, and write drivers for writing data to the bank arrays 480a, ..., 480h.

Data to be read from one bank array of the bank arrays 480a, ..., 480h may be sensed by one of the bank sense amplifiers 485a, ..., 485h coupled to the one bank array from which the data is to be read, and may be stored in the read data latches. The data stored in the read data latches may be provided to the memory controller 200 via the data I/O buffer 495. Data DQ to be written in one bank array of the bank arrays 480a, ..., 480h may be provided to the data I/O buffer 495 from the memory controller 200. The write driver may write the data DQ in one bank array of the bank arrays 480a, ..., 480h.

The command control logic 410 may control operations of the memory device 400. For example, the command control logic 410 may generate control signals for the memory device 400 in order to perform a write operation, a read operation, or a refresh operation. The command control logic 410 may generate internal command signals such as an active signal IACT, a precharge signal IPRE, a refresh signal IREF, a read signal IRD, a write signal IWR, etc., based on commands CMD transferred from the memory controller 200 in FIG. 3. The command control logic 410 may include a command decoder 411 that decodes the commands CMD received from the memory controller 200 and a mode register set 412 that sets an operation mode of the memory device 400.

Figures 9, 10:
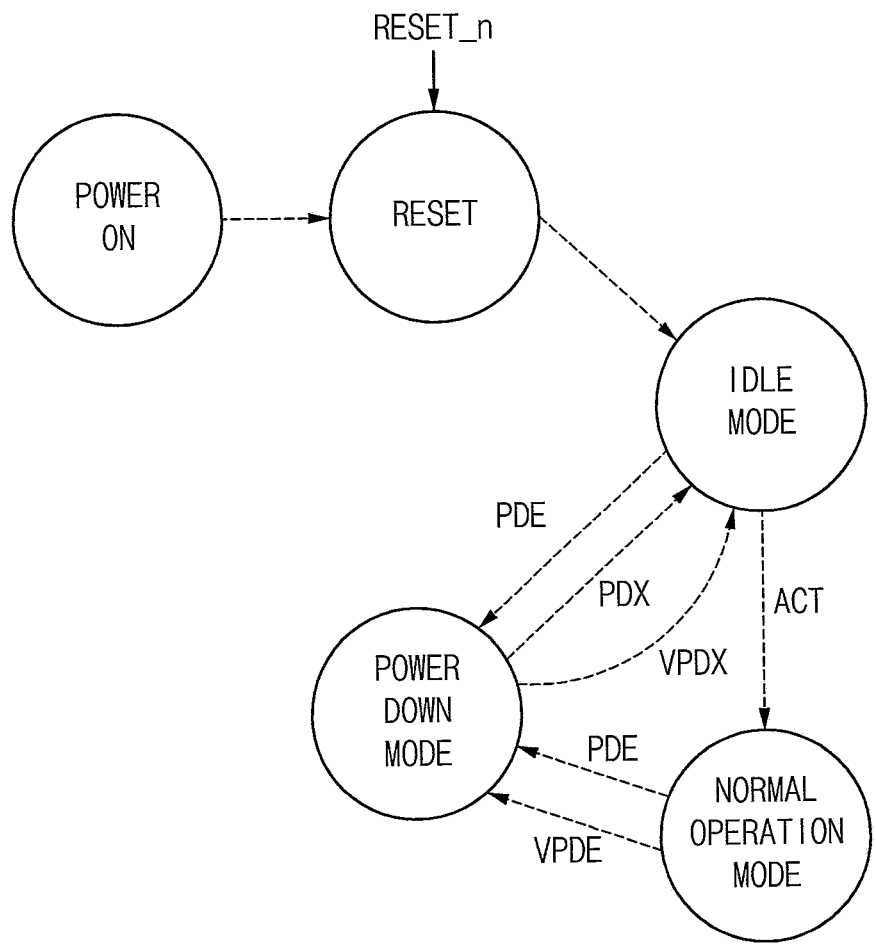
FIG. 9 is a diagram illustrating states of a semiconductor memory device according to example embodiments.
FIG. 10 is a diagram illustrating an example embodiment of power down commands of a semiconductor memory device according to example embodiments.

Although FIG. 5 illustrates the command control logic 410 and the address register 420 as being distinct from each other, the command control logic 410 and the address register 420 may be implemented as a single integrated circuit. In addition, although FIG. 9 illustrates the command CMD and the address ADDR being provided as distinct signals, the command CMD and the address ADDR may be provided as a combined signals, e.g., as specified by DDR5, HBM and LPDDR5 standards.

The temperature measurement circuit 100 may measure an operation temperature To of the semiconductor memory device 400 to generate a temperature code TCODE corresponding to the operation temperature To.

The operation limit controller 300 may, when it is determined based on the temperature code TCODE that the operation temperature To exceeds a risk temperature TR, control an internal operation of the semiconductor memory device 400 regardless of the command signals and the control signals transferred from the memory controller 200 such that power consumption of the semiconductor memory device 400 may be decreased. The control of the internal operation by the operation limit controller 300 will be further described below with reference to FIGS. 6 through 22.

Figure 6:
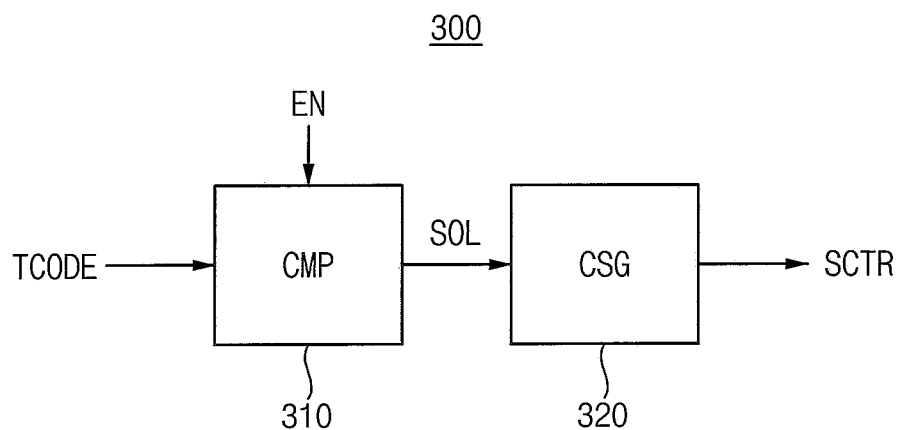
FIG. 6 is a block diagram illustrating an example embodiment of an operation limit controller included in a semiconductor memory device according to example embodiments.
Figure 7:
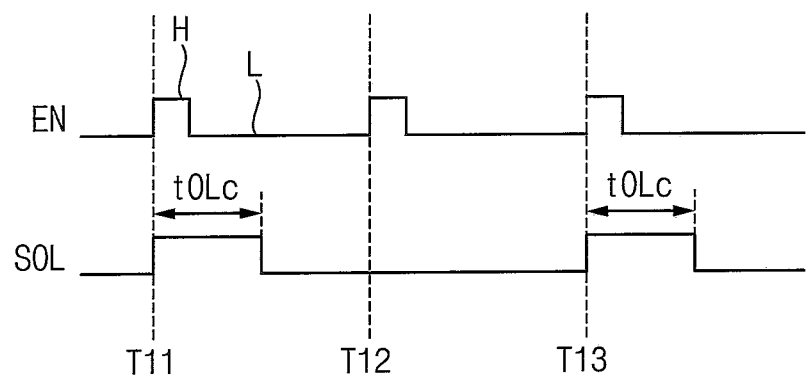
FIGS. 7 and 8 are diagrams illustrating example embodiments of operation limit signals generated in the operation limit controller of FIG. 6.
Figure 8:
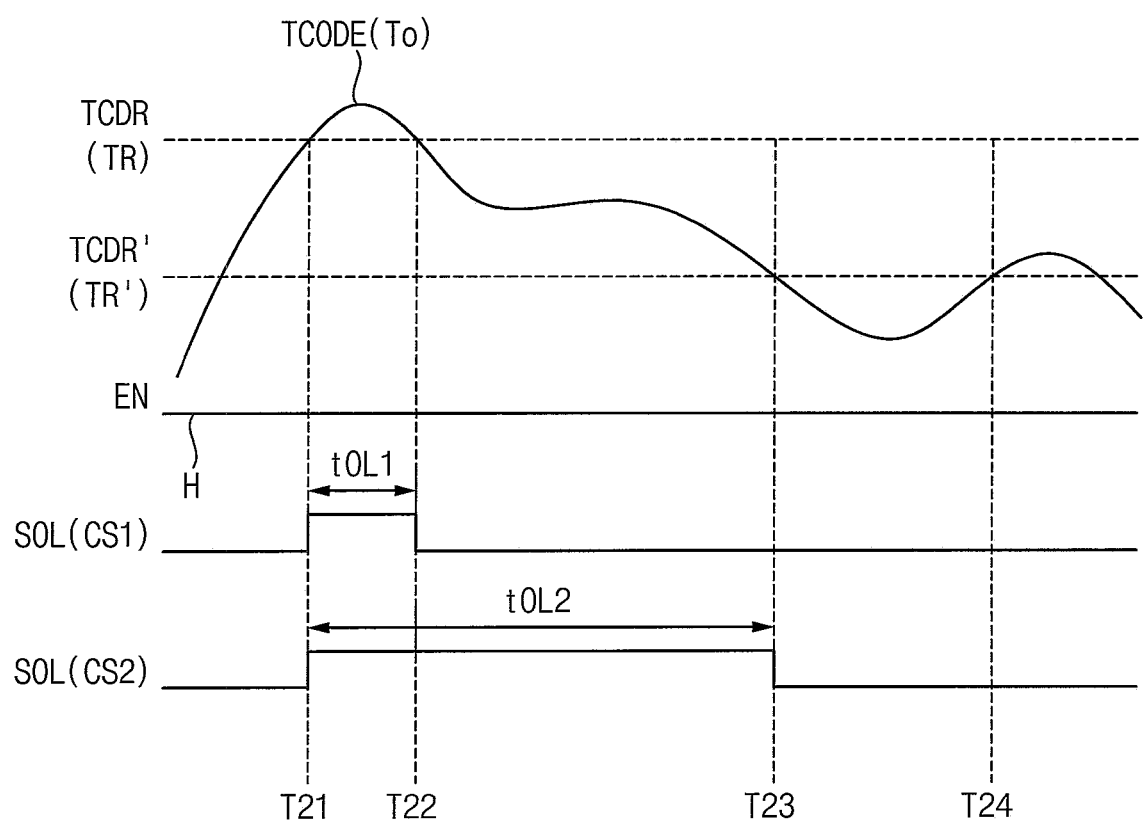

FIG. 6 is a block diagram illustrating an example embodiment of an operation limit controller included in a semiconductor memory device according to example embodiments, and FIGS. 7 and 8 are diagrams illustrating example embodiments of operation limit signals generated in the operation limit controller of FIG. 6.

Referring to FIG. 6, an operation limit controller 300 may include a comparison circuit CMP 310 and a control signal generator CSG 320.

The comparison circuit 310 may generate an operation limit signal SOL based on the operation code TCODE.

In some example embodiments, as illustrated in FIG. 7, the comparison circuit 310 may determine whether to activate the operation limit signal SOL, in response to an enable signal EN that is activated periodically from a logic low level L to a logic high level H. In this case, the comparison circuit 310 may activate the operation limit signal SOL at a time point when the operation temperature To exceeds the risk temperature TR and deactivate the operation limit signal SOL after an operation limit time tOLc that is fixed regardless of the operation temperature To. FIG. 7 illustrates an example that the operation temperature To exceeds the risk temperature TR at time points T11 and T13 and does not exceed the risk temperature TR at a time point T12.

In some example embodiments, as illustrated as a first case CS1 in FIG. 8, the comparison circuit 310 may activate the operation limit signal SOL at a time point T21 when the operation temperature To exceeds the risk temperature TR and deactivate the operation limit signal SOL at a time point T22 when the operation temperature To decreases below the risk temperature TR. In this case, the operation limit time tOL1 may be changed depending on change of the operation temperature To.

In some example embodiments, as illustrated as a second case CS2 in FIG. 8, the comparison circuit 310 may activate the operation limit signal SOL at the time point T21 when the operation temperature To exceeds the risk temperature TR and deactivate the operation limit signal SOL at a time point T23 when the operation temperature To decreases below a limit end temperature TR' that is lower than the risk temperature TR. In FIG. 8, TCDR indicates a value of the temperature code TCODE corresponding to the risk temperature TR and TCDR' indicates a value of the temperature code TCODE corresponding to the limit end temperature TR'. The enable signal EN may maintain the logic high level H. In this case, the operation limit time tOL2 may be changed depending on change of the operation temperature To. The comparison circuit 310 may not activate the operation limit signal SOL at a time point T24 when the operation temperature To exceeds the limit end temperature TR'. As such, a hysteresis scheme may be applied such that the limit end temperature TR' to deactivate the operation limit signal SOL is set to be lower than the risk temperature TR to activate the operation limit signal SOL. Through the hysteresis scheme, excessively frequent control of the internal operation may be prevented to stabilize the operation of the semiconductor memory device and efficiently prevent the physical damage of the semiconductor memory device.

The operation limit controller 300 may control the semiconductor memory device to enter a power down mode in response to activation of the operation limit signal SOL and to exit from the power down mode in response to deactivation of the operation limit signal SOL. In other words, the time interval of the power down mode may be adjusted according to the operation limit times tOLc, tOL1 and tOL2 in FIGS. 7 and 8.

The control signal generator 320 may generate signals SCTR in response to activation of the operation limit signal SOL to control the internal operation of the semiconductor memory device.

In some example embodiments, as will be described below with reference to FIGS. 11, 12, 13 and 14, the signals SCTR generated by the control signal generator 320 may include a virtual clock enable signal VCKE and a virtual chip selection signal VCS_n.

In some example embodiments, as will be described below with reference to FIGS. 15, 16, 17 and 18, the signals SCTR may include virtual command-address signals VR0, VR1, VR2 and VR3.

In some example embodiments, as will be described below with reference to FIGS. 20 and 21, the signals SCTR may include a virtual reset signal VRESET_n and a virtual chip selection signal VCS_n.

FIG. 9 is a diagram illustrating states of a semiconductor memory device according to example embodiments.

Referring to FIG. 9, when a semiconductor memory device is powered on, a reset operation may be performed based on a reset signal RESET_N transferred from a memory controller. The semiconductor memory device may enter an idle mode after the reset operation is completed. The semiconductor memory device may exit from the idle mode and enter a normal operation mode based on an active command ACT transferred from the memory controller.

In addition, the semiconductor memory device may enter a power down mode based on a power down enter command PDE and escape from the power down mode based on a power down exit command, which are transferred from the memory controller.

In general, the power consumption in the idle mode is lower than the power consumption in the normal operation mode, and the power consumption in the power down mode is lower than the power consumption in the idle mode.

According to example embodiments, when the operation temperature To exceeds the risk temperature TR, virtual commands or virtual control signals may be generated inside the semiconductor memory device to reset the semiconductor memory device or cause the semiconductor memory device to enter the power down mode (from either idle mode or normal operation mode, see FIG. 9), thereby reducing the power consumption. Through the compulsory power reduction, the operation temperature To may be decreased and the physical damage of the semiconductor memory device may be prevented. Commands VPDE and VPDX which are from the OLCON 300 are also shown in FIG. 9.

FIG. 10 is a diagram illustrating an example embodiment of power down commands of a semiconductor memory device according to example embodiments. FIG. 10 illustrates power down commands according to DDR4 standards.

Referring to FIG. 10, the power down commands may include a power down enter command PDE and a power down exit command PDX. According to the DDR4 standards, the power down enter command PDE and the power down exit command PDX may be determined based on a logic level of the clock enable signal CKE and based on the chip selection signal CS_n at a first edge EG1 and a second edge EG2 of the clock signal. In FIG. 10, H indicates a logic high level and L indicates a logic low level.

Figure 11:
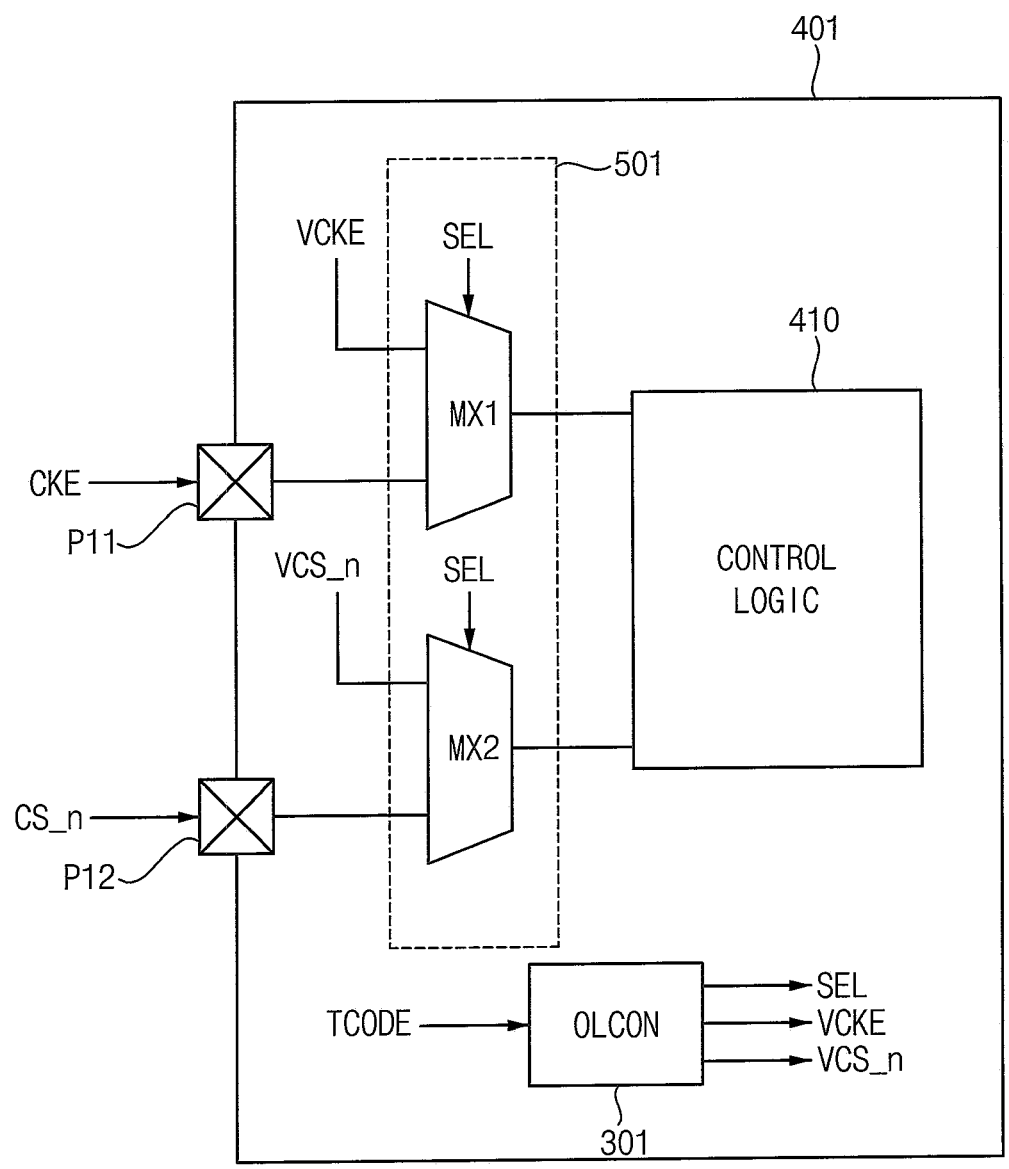
FIG. 11 is a block diagram illustrating a semiconductor memory device according to example embodiments.

FIG. 11 is a block diagram illustrating a semiconductor memory device according to example embodiments. FIG. 11 illustrates components for describing example embodiments, and other components as described with reference to FIG. 5 are omitted.

Referring to FIG. 11, a semiconductor memory device 401 may include control pins P11 and P12, a command control logic 410, an operation limit controller OLCON 301 and a selector 501.

The selector 501 may transfer a virtual clock enable signal VCKE and a virtual chip selection signal VCS_n to the command control logic 410, in replacement of a clock enable signal CKE and a chip selection signal CS_n that are transferred from the memory controller through the control pins P11 and P12.

The operation limit controller 301 may generate the virtual clock enable signal VCKE and the virtual chip selection signal VCS_n corresponding to the power down commands PDE and PDX, when the operation temperature To exceeds the risk temperature TR.

The selector 501 may include a first multiplexer MX1 and a second multiplexer MX2, which operate based on a selection signal SEL. The selection signal SEL may be generated by the operation limit controller 301.

The first multiplexer MX1 may select the virtual clock enable signal VCKE when the selection signal SEL has an activation level (e.g., the logic high level H) and provide the virtual clock enable signal VCKE to the command control logic 410. In contrast, the first multiplexer MX1 may select the clock enable signal CKE when the selection signal SEL has a deactivation activation level (e.g., the low high level L) and provide the clock enable signal CKE to the command control logic 410.

The second multiplexer MX2 may select the virtual chip selection signal VCS_n when the selection signal SEL has the activation level and provide the virtual chip selection signal VCS_n to the command control logic 410. In contrast, the second multiplexer MX2 may select the chip selection signal CS_n when the selection signal SEL has the deactivation level and provide the chip selection signal CS_n to the command control logic 410.

Figure 12:
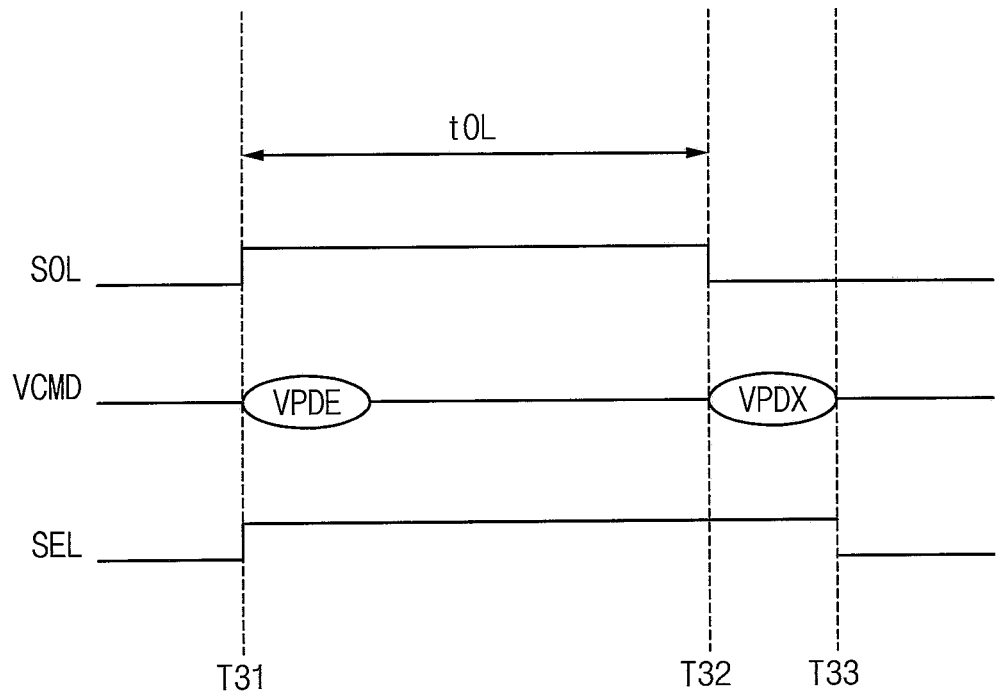
FIG. 12 is a timing diagram illustrating an operation of an operation limit controller included in the semiconductor memory device of FIG. 11.
Figure 13:
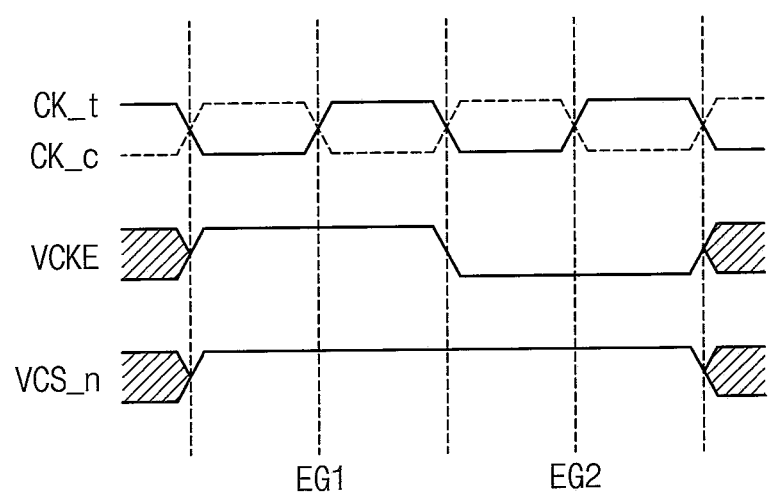
FIGS. 13 and 14 are diagrams illustrating an example embodiment of virtual power down commands generated in an operation limit controller included in the semiconductor memory device of FIG. 11.
Figures 14, 15:
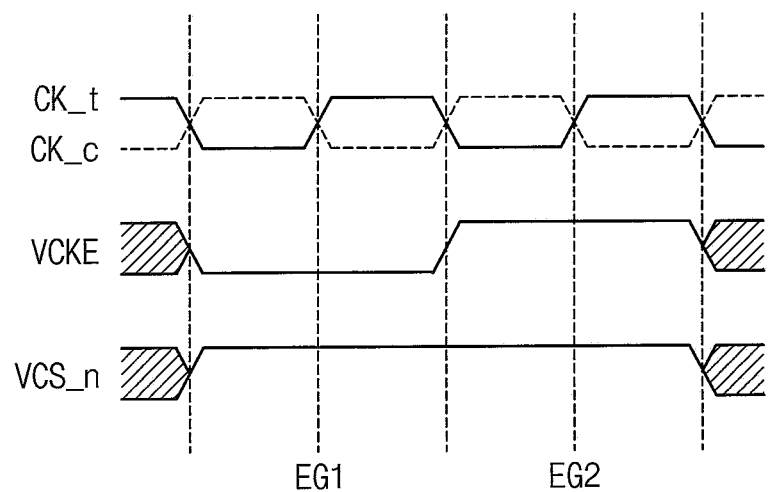
FIG. 15 is a diagram illustrating an example embodiment of power down commands of a semiconductor memory device according to example embodiments.

FIG. 12 is a timing diagram illustrating an operation of an operation limit controller included in the semiconductor memory device of FIG. 11. FIGS. 13 and 14 are diagrams illustrating an example embodiment of virtual power down commands generated in an operation limit controller included in the semiconductor memory device of FIG. 11.

Referring to FIG. 12, the operation limit controller 301 may generate a virtual command VCMD based on timing of the operation limit signal SOL. The virtual command VCMD may include a virtual power down enter command VPDE and a virtual power down exit command VPDX.

The operation limit controller 301 may generate the virtual power down enter command VPDE as illustrated in FIG. 13 in response to activation of the operation limit signal SOL, for example, at a time point T31. In addition, the operation limit controller 301 may generate the virtual power down exit command VPDX as illustrated in FIG. 14 in response to deactivation of the operation limit signal SOL, for example, at a time point T32. Also see the state transitions shown in FIG. 9 and referring to VPDE and VPDX.

FIGS. 13 and 14 illustrate logic levels of the virtual clock enable signal VCKE and the virtual chip selection signal VCS_n with vertical dashed lines marking a first edge EG1 and a second edge EG2 of a clock signal CK_t and a complementary clock signal CK_c. The control signal generator 320 in FIG. 6 may generate the virtual power down enter command VPDE and the virtual power down exit command VPDX having the same levels of the power down enter command PDE and the power down exit command PDX illustrated in FIG. 10. As a result, the command control logic 410 may perform the power down enter and exit sequences based on the virtual power down enter command VPDE and the virtual power down exit command VPDX, which are exactly the same as the sequences based on the power down enter command PDE and the power down exit command PDX. In some embodiments the operation limit controller OLCON 300 inside, for example, the memory 400 (or 401 or 402, etc.), spoofs control signals from, for example, the memory controller 200. Some examples of the spoofed control signals may be referred to as, for example, the virtual power down enter command VPDE, the virtual power down exit command VPDX, a virtual reset signal VRESET and a virtual chip selection signal VCS. After the temperature has returned to a normal regime (in a non-limiting example, such as after the time T23 in FIG. 8), the spoofing is suspended and the memory comes again under the control of the memory controller 200. As another example of transition to and from spoofing, see FIG. 12 at T31 ("VPDE") and from T32 to T33 ("VPDX").

The operation limit controller 301 may activate the selection signal SEL in response to activation of the operation limit signal SOL, for example, at the time point T31, and deactivate the selection signal SEL based on deactivation of the operation limit signal SOL, for example, at a time point T33.

As a result, the operation limit controller 301 may control the semiconductor memory device 401 such that the semiconductor memory device 401 may enter the power down mode in response to the virtual power down enter command VPDE and exit from the power down mode in response to the virtual power down exit command VPDX.

FIG. 15 is a diagram illustrating an example embodiment of power down commands of a semiconductor memory device according to example embodiments. FIG. 15 illustrates power down commands according to HBM standards.

Referring to FIG. 15, the power down commands may include a power down enter command PDE and a power down exit command PDX. According to the HBM standards, the power down enter command PDE and the power down exit command PDX may be determined logic level of a portion of row command-address signals R0, . . . , R3 at a rising edge EGr and a falling edge EGf of the clock signal CK. H indicates a logic high level and L indicates a logic low level.

Figure 16:
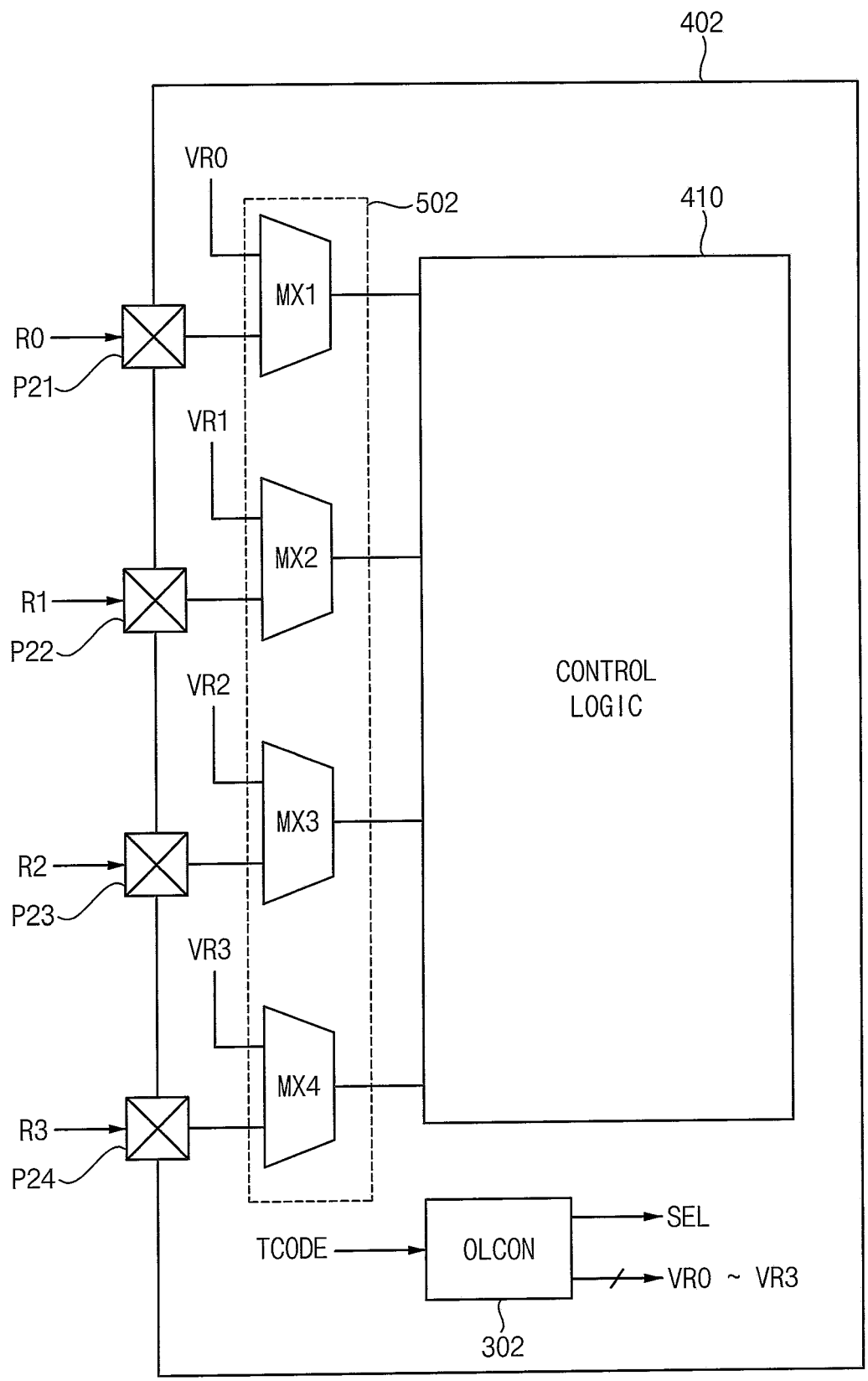
FIG. 16 is a block diagram illustrating a semiconductor memory device according to example embodiments.

FIG. 16 is a block diagram illustrating a semiconductor memory device according to example embodiments. FIG. 16 illustrates components for describing example embodiments, and other components as described with reference to FIG. 5 are omitted.

Referring to FIG. 16, a semiconductor memory device 402 may include control pins P21, P22, P23, P24, a command control logic 410, an operation limit controller OLCON 302 and a selector 502.

The selector 502 may transfer first through fourth virtual row command-address signals VR0, VR1, VR2, VR3 to the command control logic 410, in replacement of first through fourth row command-address signals R0, . . . , R3 that are transferred from the memory controller through the control pins P21, . . . , P24.

The operation limit controller 301 may generate the virtual row command-address signals VR0, . . . , VR3 corresponding to the power down commands PDE and PDX, when the operation temperature To exceeds the risk temperature TR.

The selector 501 may include first through fourth multiplexers MX1, . . . , MX4, which operate based on a selection signal SEL. The selection signal SEL may be generated by the operation limit controller 302.

The first multiplexer MX1 may select the first virtual row command-address signal VR0 when the selection signal SEL has an activation level (e.g., the logic high level H) and provide the first virtual row command-address signal VR0 to the command control logic 410. In contrast, the first multiplexer MX1 may select the first row command-address signal R0 when the selection signal SEL has a deactivation level (e.g., the logic low level L) and provide the first row command-address signal R0 to the command control logic 410.

The second multiplexer MX2 may select the second virtual row command-address signal VR1 when the selection signal SEL has the activation level and provide the second virtual row command-address signal VR1 to the command control logic 410. In contrast, the second multiplexer MX2 may select the second row command-address signal R1 when the selection signal SEL has the deactivation level and provide the second row command-address signal R1 to the command control logic 410.

The third multiplexer MX3 may select the third virtual row command-address signal VR2 when the selection signal SEL has the activation level and provide the third virtual row command-address signal VR2 to the command control logic 410. In contrast, the third multiplexer MX3 may select the third row command-address signal R2 when the selection signal SEL has the deactivation level and provide the third row command-address signal R2 to the command control logic 410.

The fourth multiplexer MX4 may select the fourth virtual row command-address signal VR3 when the selection signal SEL has the activation level and provide the fourth virtual row command-address signal VR3 to the command control logic 410. In contrast, the fourth multiplexer MX4 may select the fourth row command-address signal R3 when the selection signal SEL has the deactivation level and provide the fourth row command-address signal R3 to the command control logic 410.

Figure 17:
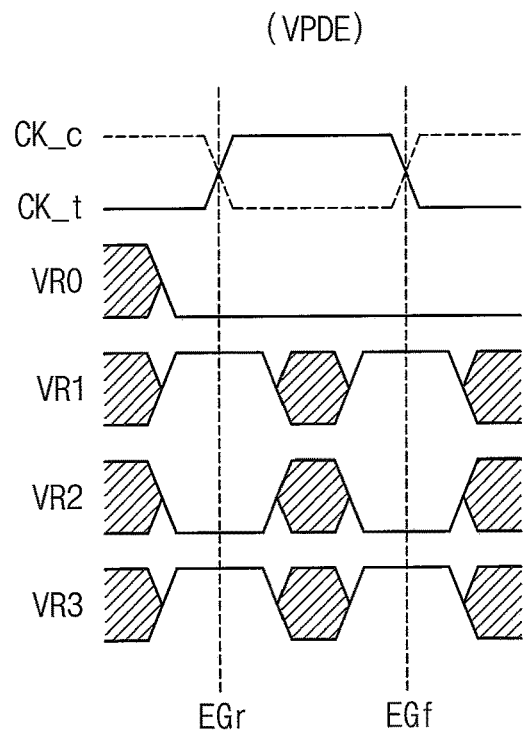
FIGS. 17 and 18 are diagrams illustrating an example embodiment of virtual power down commands generated in an operation limit controller included in the semiconductor memory device of FIG. 16.
Figure 18:
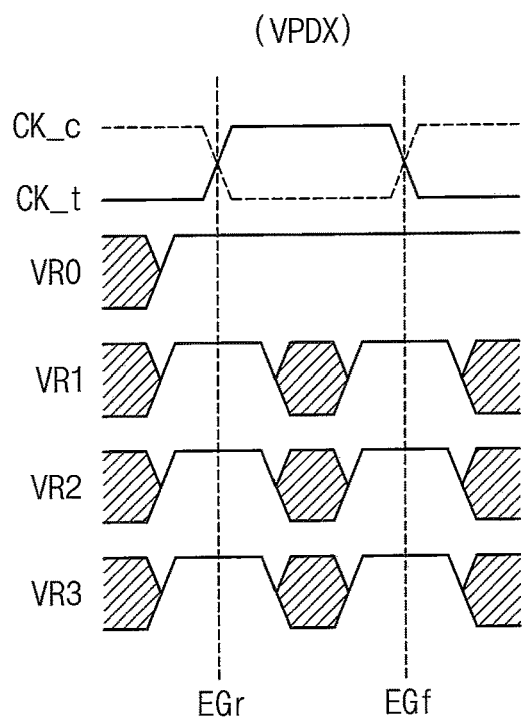

FIGS. 17 and 18 are diagrams illustrating an example embodiment of virtual power down commands generated in an operation limit controller included in the semiconductor memory device of FIG. 16.

As described with reference to FIG. 12, the operation limit controller 302 may generate a virtual command VCMD based on timing of the operation limit signal SOL. The virtual command VCMD may include a virtual power down enter command VPDE and a virtual power down exit command VPDX.

The operation limit controller 302 may generate the virtual power down enter command VPDE as illustrated in FIG. 17 in response to activation of the operation limit signal SOL and generate the virtual power down exit command VPDX as illustrated in FIG. 18 in response to deactivation of the operation limit signal SOL FIGS. 17 and 18 illustrate logic level of the virtual row command-address signals R0, . . . , R3 at a rising edge EGr and a falling edge EGf of a clock signal CK_t. The control signal generator 320 in FIG. 6 may generate the virtual power down enter command VPDE and the virtual power down exit command VPDX having the same levels of the power down enter command PDE and the power down exit command PDX illustrated in FIG. 15. As a result, the command control logic 410 may perform the power down enter and exit sequences based on the virtual power down enter command VPDE and the virtual power down exit command VPDX, which are exactly the same as the sequences based on the power down enter command PDE and the power down exit command PDX.

In addition, as described with reference to FIG. 12, the operation limit controller 302 may activate the selection signal SEL in response to activation of the operation limit signal SOL, for example, at the time point T31, and deactivate the selection signal SEL based on deactivation of the operation limit signal SOL, for example, at a time point T33.

As a result, the operation limit controller 302 may control the semiconductor memory device 402 such that the semiconductor memory device 402 may enter the power down mode in response to the virtual power down enter command VPDE and exit from the power down mode in response to the virtual power down exit command VPDX.

Figures 19, 20:
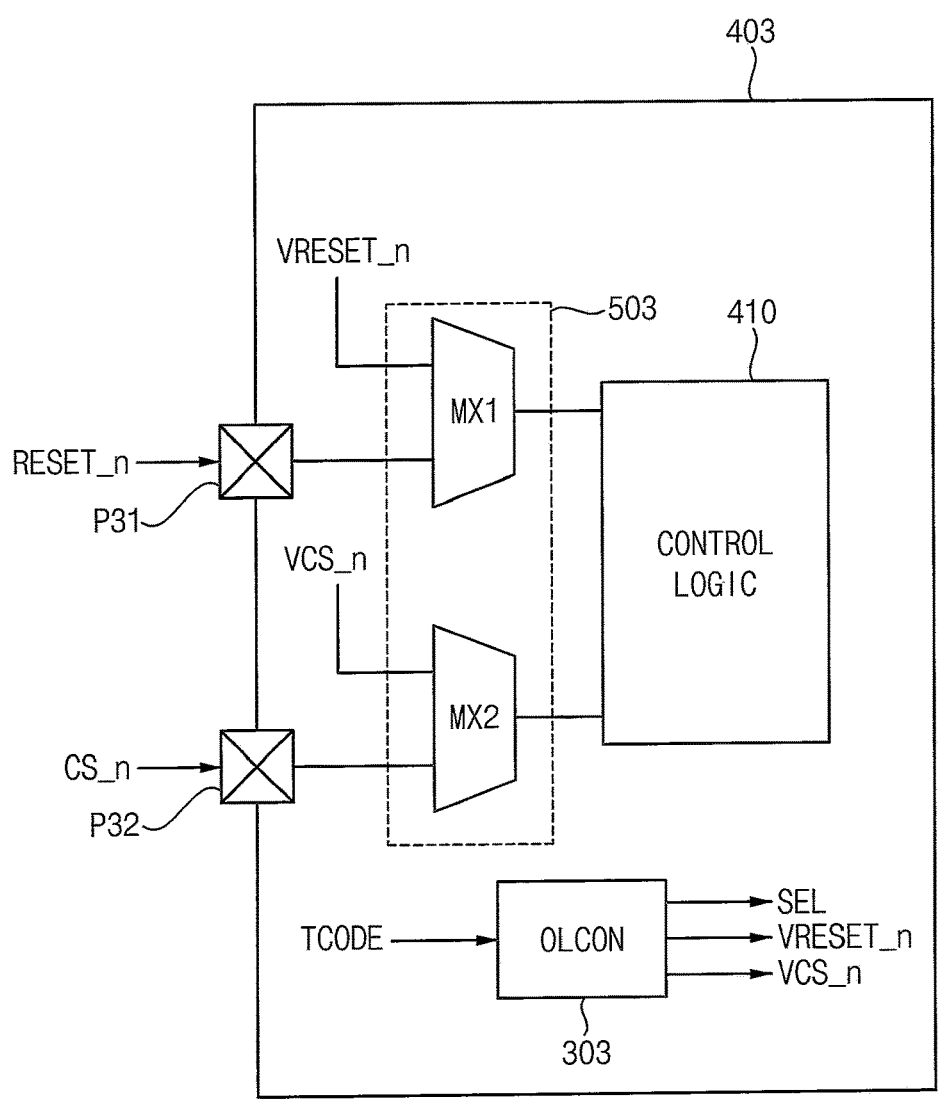
FIG. 19 is a diagram illustrating an example embodiment of power down commands of a semiconductor memory device according to example embodiments.
FIG. 20 is a block diagram illustrating a semiconductor memory device according to example embodiments.

FIG. 19 is a diagram illustrating an example embodiment of power down commands of a semiconductor memory device according to example embodiments. FIG. 19 illustrates power down commands according to DDR5 standards.

Referring to FIG. 19, the power down commands may include a power down enter command PDE and a power down exit command PDX. According to the DDR5 standards, the power down enter command PDE and the power down exit command PDX may be determined logic level of a chip selection signal CS_n and a portion of command-address signals CA0, . . . , CA4 at a rising edge of a clock signal. H indicates a logic high level and L indicates a logic low level.

The configuration and the operation of the semiconductor memory device may be substantially the same as described with reference to FIGS. 16 through 18, and repeated descriptions are omitted.

As described above, the operation limit controller may generate a virtual command VCMD based on timing of the operation limit signal SOL. The virtual command VCMD may include a virtual power down enter command VPDE and a virtual power down exit command VPDX. The operation limit controller may generate the virtual power down enter command VPDE in response to activation of the operation limit signal SOL and generate the virtual power down exit command VPDX in response to deactivation of the operation limit signal SOL.

Figure 21:
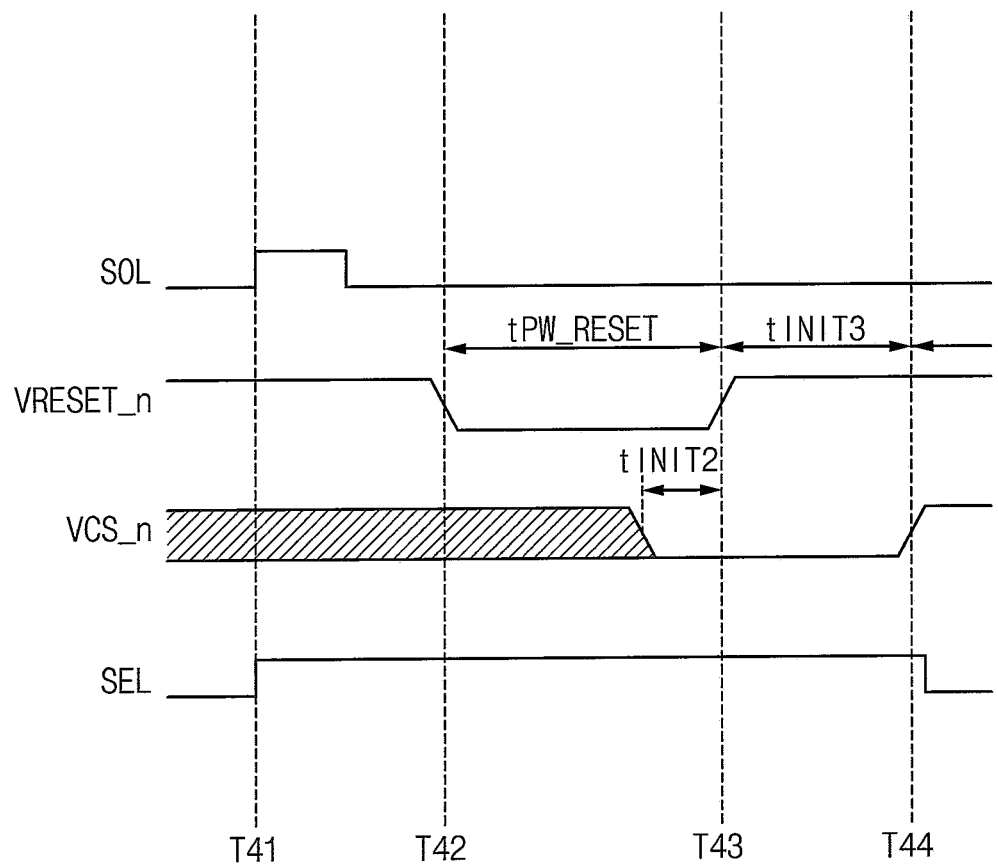
FIG. 21 is a diagram illustrating an example embodiment of virtual power down commands generated in an operation limit controller included in the semiconductor memory device of FIG. 20.

FIG. 20 is a block diagram illustrating a semiconductor memory device according to example embodiments, and FIG. 21 is a diagram illustrating an example embodiment of virtual power down commands generated in an operation limit controller included in the semiconductor memory device of FIG. 20. FIG. 20 illustrates components for describing example embodiments, and other components as described with reference to FIG. 5 are omitted.

Referring to FIG. 20, a semiconductor memory device 403 may include control pins P31 and P32, a command control logic 410, an operation limit controller OLCON 303 and a selector 503.

The selector 503 may transfer a virtual reset signal VRESET_n and a virtual chip selection signal VCS_n to the command control logic 410, in replacement of a reset signal RESET_n and a chip selection signal CS_n that are transferred from the memory controller through the control pins P31 and P32.

The operation limit controller 303 may generate the virtual reset signal VRESET_n and the virtual chip selection signal VCS_n corresponding to the power down commands PDE and PDX as illustrated in FIG. 21, when the operation temperature To exceeds the risk temperature TR. The timings of the selection signal SEL, the virtual reset signal VRESET_n and the virtual chip selection signal VCS_n may be determined based on the timings of the operation limit signal SOL. tPW_RESET, tINT2 and tINT3 are the same as specified in the DDR5 standards.

For example, the operation temperature To of the semiconductor memory device 403 may exceed the risk temperature TR at a time point t41. At the time point T41, the comparison circuit 310 in FIG. 6 may activate the operation limit signal SOL and the control signal generator 320 may activate the selection signal SEL in response to activation of the operation limit signal SOL. Subsequently, tPW_RESET is asserted from time point T42 to time point T43. The control signal generator 320 may transition the virtual reset signal VRESET_n and the virtual chip selection signal VCS_n to have the same timings as specified in the DDR5 standards. After a time point T44, the control signal generator 320 may deactivate the selection signal SEL.

Figure 22:
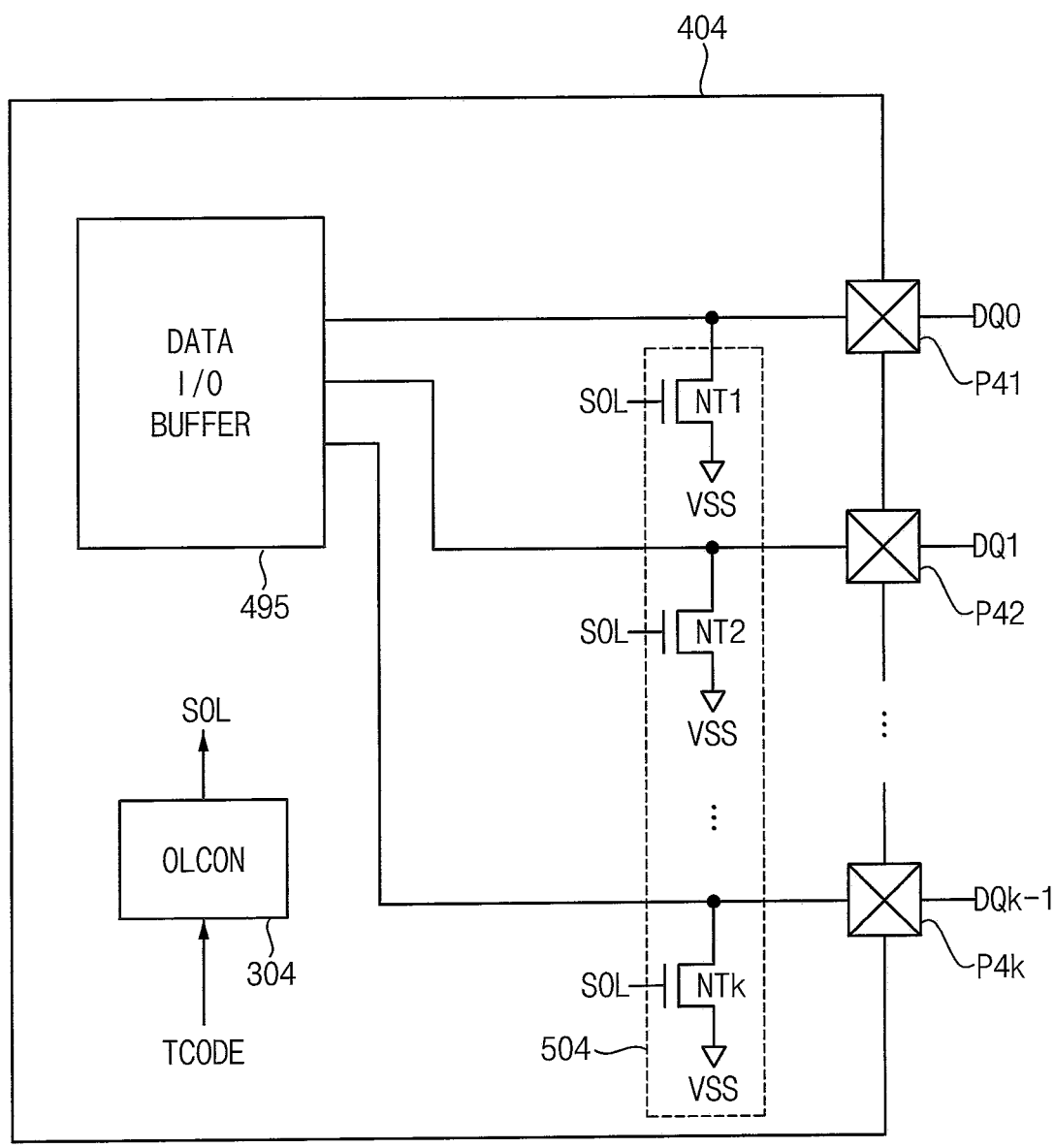
FIG. 22 is a block diagram illustrating a semiconductor memory device according to example embodiments.

FIG. 22 is a block diagram illustrating a semiconductor memory device according to example embodiments. FIG. 22 illustrates components for describing example embodiments, and other components as described with reference to FIG. 5 are omitted.

Referring to FIG. 22, a semiconductor memory device 404 may include data pins P41, . . . , P4k, a data input-output buffer 495, an operation limit controller OLCON 304 and a data error generator 504.

The data error generator 504 may pull down at least a portion of the data pins P41, P42, . . . , P4k to a ground voltage VSS in response to activation of the operation limit signal SOL. According to example embodiments, the data error generator 504 may pull up at least a portion of the data pins P41, . . . , P4k to a power supply voltage in response to activation of the operation limit signal SOL.

In some example embodiments, as illustrated in FIG. 22, the data error generator 504 may include transistors NT1, . . . , NTk to pull down the data pins P41, . . . , P4k based on the operation limit signal SOL.

As described with reference to FIGS. 6 through 8, the operation limit controller 304 may activate the operation limit signal SOL when the operation temperature To exceeds the risk temperature TR. As a result, the data error generator 504 may transfer data including errors to the memory controller regardless of read data, which are provided from the data input-output buffer 495, when the operation temperature exceeds the risk temperature.

The ECC engine included in the memory controller 200 of FIG. 2 may decode the read data provided from the semiconductor memory device 400. If the error of the read data is uncorrectable, the memory controller 200 may take proper steps. For example, the memory controller 200 may reset the semiconductor memory device 400 when the error of the read data is uncorrectable. The operation temperature To may be reduced under control of the memory controller 200 by intentionally causing errors in the data provided to the memory controller 200 as described with reference to FIG. 22. By pulling a sufficient number of pins either to VCC or to ground, the likelihood of uncorrectable error for any given portion of data can be made close to certain (a probability of almost 1). Then, for example, the errors of the data error generator 504 may cause the memory controller 200, based on the ECC engine detection of uncorrectable errors, to take corrective action such as reset of the semiconductor memory device 400.

Figure 23:
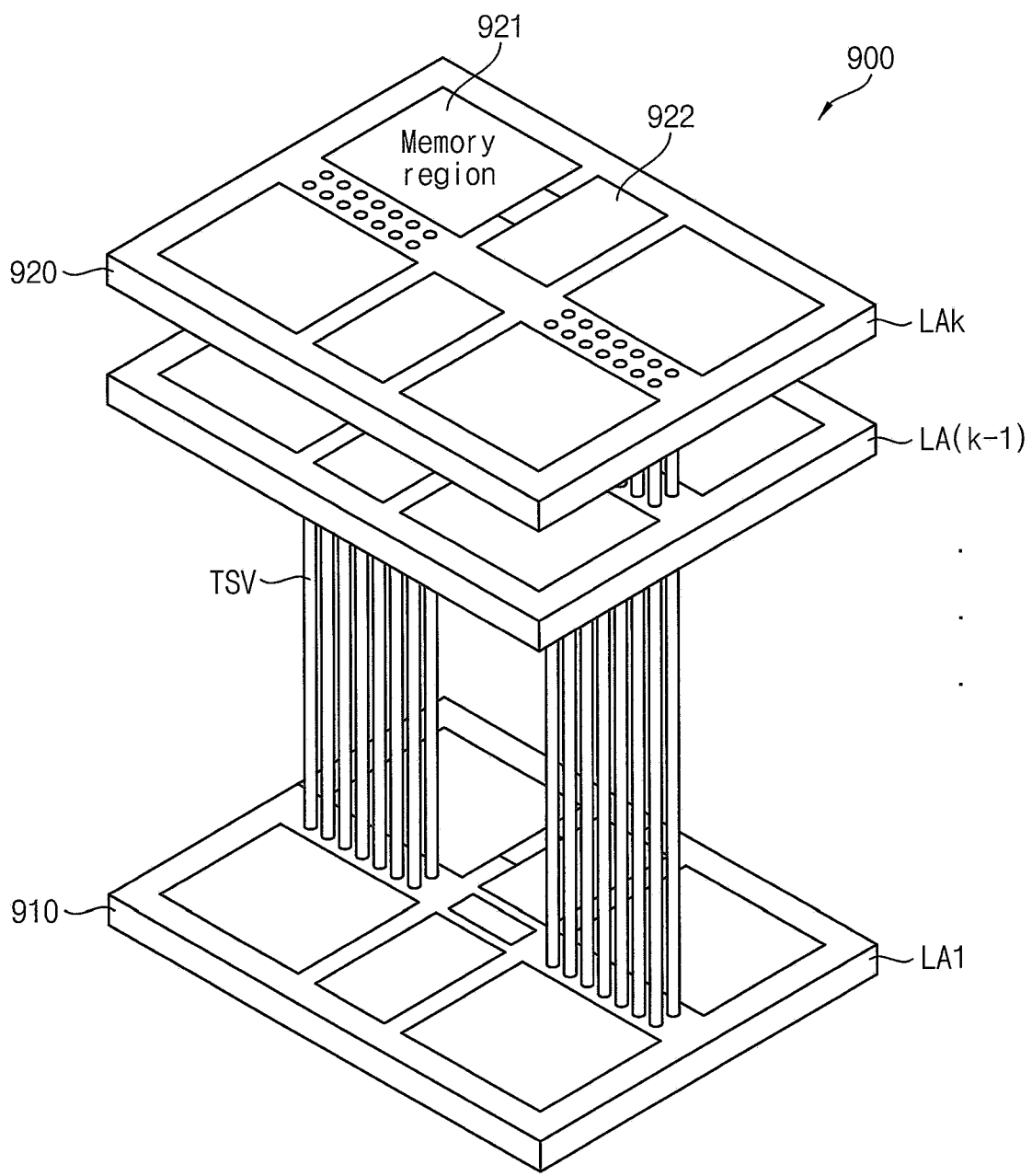
FIGS. 23 and 24 are diagrams illustrating a stacked memory device according to example embodiments.
Figure 24:
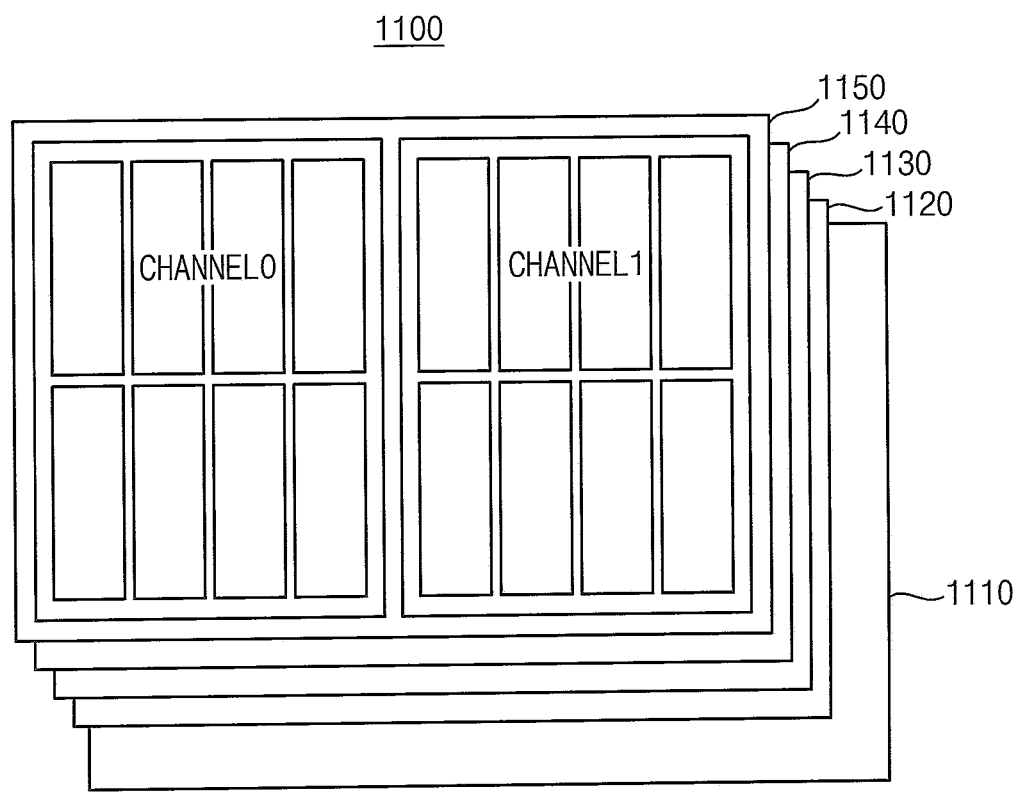

FIGS. 23 and 24 are diagrams illustrating a stacked memory device according to example embodiments.

Referring to FIG. 23, a semiconductor memory device 900 may include first through kth semiconductor integrated circuit layers LA1 (9100 through LAk (920), in which the lowest, first semiconductor integrated circuit layer LA1 is assumed to be an interface or control chip, and the other semiconductor integrated circuit layers LA2 through LAk are assumed to be slave chips including core memory chips. The slave chips may form a plurality of memory ranks as described above.

The first through kth semiconductor integrated circuit layers LA1 through LAk may transmit and receive signals between the layers by through-substrate vias TSVs (e.g., through-silicon vias). The lowest first semiconductor integrated circuit layer LA1, as the interface or control chip, may communicate with an external memory controller through a conductive structure formed on an external surface.

Each of the first semiconductor integrated circuit layer LA1 910 through the kth semiconductor integrated circuit layer LAk 920 may include memory regions 921 and peripheral circuits 922 for driving the memory regions 921. For example, the peripheral circuits 922 may include a row-driver for driving wordlines of a memory, a column-driver for driving bit lines of the memory, a data input-output circuit for controlling input-output of data, a command buffer for receiving a command from an outside source and buffering the command, and an address buffer for receiving an address from an outside source and buffering the address.

The first semiconductor integrated circuit layer LA1 910 may further include a control circuit. The control circuit may control access to the memory region 921 based on a command and an address signal from a memory controller and may generate control signals for accessing the memory region 921.

Each of the semiconductor integrated circuit layers LA2 through LAk corresponding to the slave layers may include a refresh control circuit as described above. The refresh control circuit may selectively perform the fixed hammer control mode FHCM or the variable hammer control mode VHCM as described above.

FIG. 24 illustrates an example high bandwidth memory (HBM) organization. Referring to FIG. 24, a HBM 1100 may have a stack of multiple DRAM semiconductor dies 1120, 1130, 1140, and 1150. The HBM of the stack structure may be optimized by a plurality of independent interfaces, i.e., channels. Each DRAM stack may support up to 8 channels in accordance with HBM standards. FIG. 24 shows an example stack containing 4 DRAM semiconductor dies 1120, 1130, 1140, and 1150, and each DRAM semiconductor die supports two channels CHANNEL0 and CHANNEL1.

Each channel provides access to an independent set of DRAM banks. Requests from one channel may not access data attached to a different channel. Channels are independently clocked, and need not be synchronous.

The HBM 1100 may further include an interface die 1110 or a logic die at bottom of the stack structure to provide signal routing and other functions. Some functions for the DRAM semiconductor dies 1120, 1130, 1140, and 1150 may be implemented in the interface die 1110.

Each of the DRAM semiconductor dies 1120, 1130, 1140, and 1150 may include a temperature measurement circuit and an operation limit controller as described above. In some example embodiments, the interface die 1110 may include a temperature measurement circuit and an operation limit controller as described above.

Figure 25:
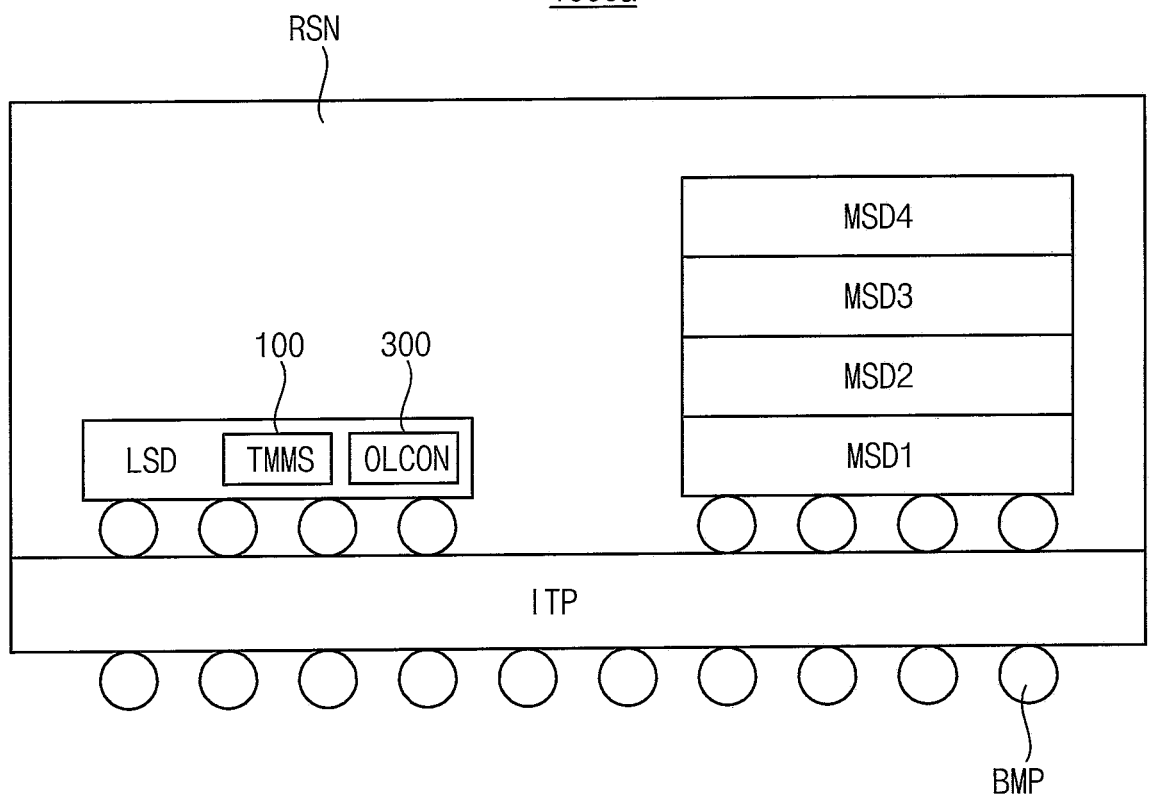
FIGS. 25 and 26 are diagrams illustrating packaging structures of a stacked memory device according to example embodiments.
Figure 26:
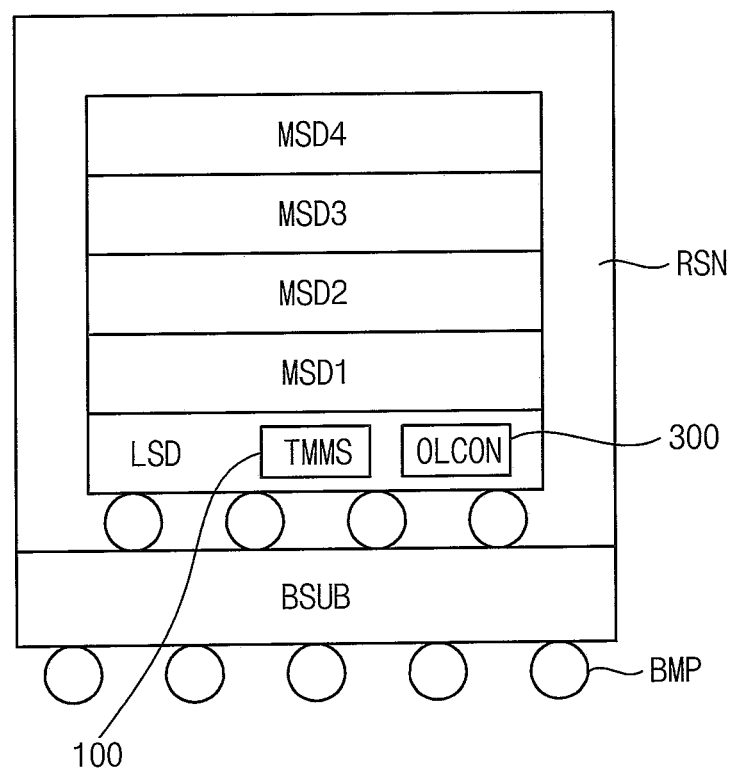

FIGS. 25 and 26 are diagrams illustrating packaging structures of a stacked memory device according to example embodiments.

Referring to FIG. 25, a memory device 1000a may be a memory package, and may include a base substrate or an interposer ITP and a stacked memory device stacked on the interposer ITP. The stacked memory device may include a logic semiconductor die LSD (or a buffer semiconductor die) and a plurality of memory semiconductor dies MSD1, . . . , MSD4.

Referring to FIG. 26, a memory device 1000b may be a memory package and may include a base substrate BSUB and a stacked memory device stacked on the base substrate BSUB. The stacked memory device may include a logic semiconductor die LSD and a plurality of memory semiconductor dies MSD1, . . . , MSD4.

FIG. 25 illustrates a structure in which the memory semiconductor dies MSD1, . . . , MSD4 except for the logic semiconductor die LSD are stacked vertically and the logic semiconductor die LSD is electrically connected to the memory semiconductor dies MSD1, . . . , MSD4 through the interposer ITP or the base substrate. In contrast, FIG. 26 illustrates a structure in which the logic semiconductor die LSD is stacked vertically with the memory semiconductor dies MSD1, . . . , MSD4.

A temperature measurement circuit and an operation limit controller as described above may be disposed in the logic semiconductor die LSD. The temperature measurement may measure the operation temperature of the stacked memory device to generate the temperature code corresponding to the operation temperature. The operation limit controller may, when it is determined based on the temperature code that the operation temperature exceeds a risk temperature, control an internal operation of the stacked memory device regardless of the command signals and the control signals transferred from the memory controller such that power consumption of the stacked memory device is decreased.

The base substrate BSUB may be the same as the interposer ITP or include the interposer ITP. The base substrate BSUB may be a printed circuit board (PCB). External connecting elements such as conductive bumps BMP may be formed on a lower surface of the base substrate BSUB and internal connecting elements such as conductive bumps may be formed on an upper surface of the base substrate BSUB. In some example embodiments, the semiconductor dies LSD and MSD1, . . . , MSD4 may be electrically connected through through-silicon vias. In other example embodiments, the semiconductor dies LSD and MSD1, . . . , MSD4 may be electrically connected through the bonding wires. In still other example embodiments, the semiconductor dies LSD and MSD1, . . . , MSD4 may be electrically connected through a combination of the through-silicon vias and the bonding wires. In the example embodiment of FIG. 25, the logic semiconductor die LSD may be electrically connected to the memory semiconductor dies MSD1, . . . , MSD4 through conductive line patterns formed in the interposer ITP. The stacked semiconductor dies LSD and MSD1, . . . , MSD4 may be packaged using an encapsulant such as resin RSN.

Figure 27:
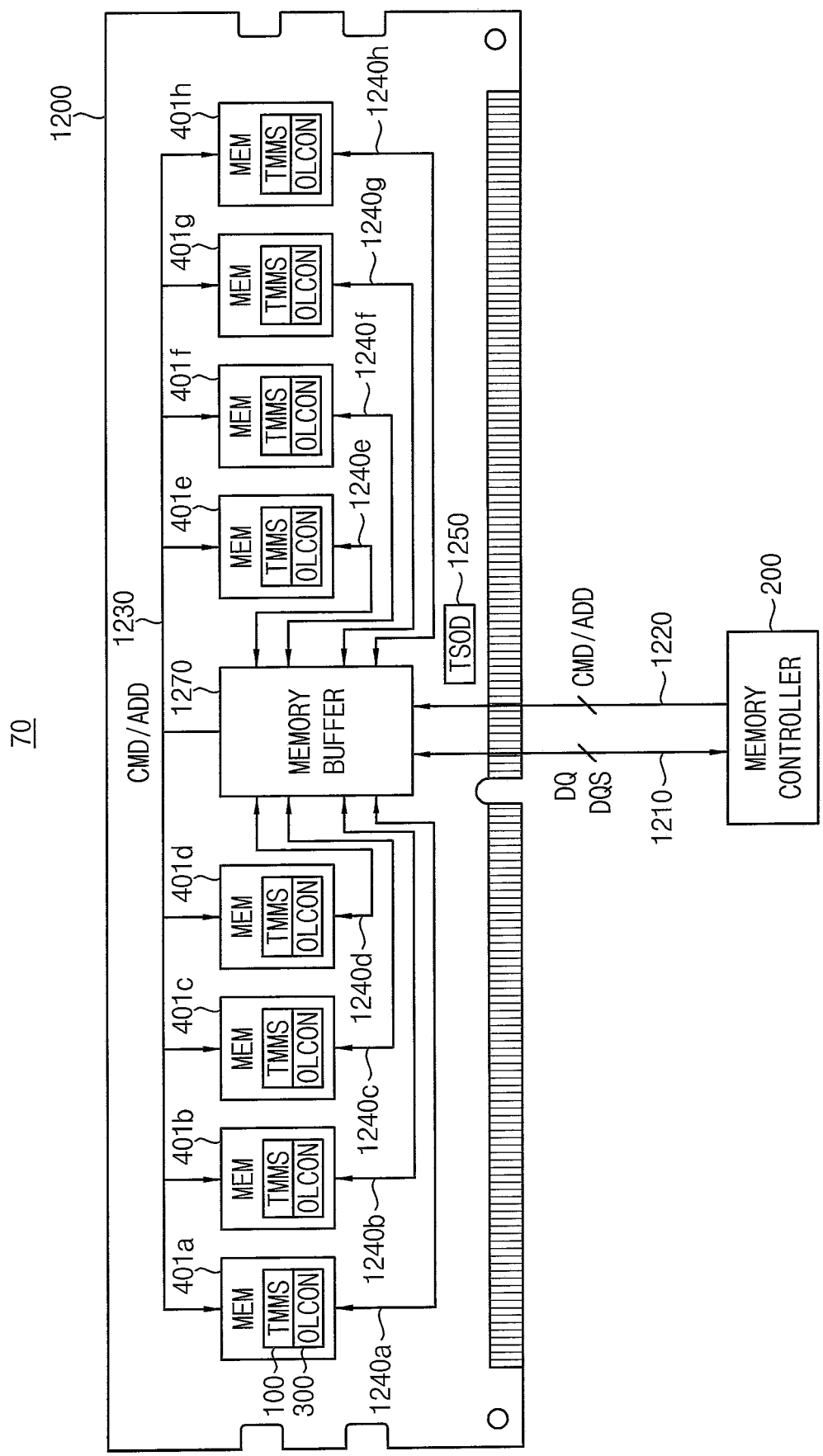
FIG. 27 is a diagram illustrating a memory system according to example embodiments.

FIG. 27 is a diagram illustrating a memory system according to example embodiments.

As illustrated in FIG. 27, a memory systems 70 may include a memory module 1200 and a memory controllers 200. The memory module 1200 may include a module substrate and a plurality of memory chips 401a, 401b, 401c, 401d, 401e, 401f, 401g, 401h and a module sensor TSOD 1250 that are mounted on the module substrate. FIG. 27 illustrates a non-limiting example of eight memory chips 401a, . . . , 401h, however the number of memory chips included in the memory module 1200 may be determined variously.

Referring to FIG. 24, the memory module 1200 may be connected to the memory controller 200 via a data bus 1210 and a control bus 1220. The memory module 1200 may be inserted into a socket connector of a larger memory system or computational system. Electric connectors (or pins) of the memory module 1200 may be connected to electric contacts of the socket connector. The electric connectors and the buses 1210 and 1220 connected to the electric contacts allow direct access to a memory buffer or a buffer chip 1270 and indirect access to the memory chips 401a, . . . , 401h of the memory module 1200. The data bus 1210 may include signal lines (conductive wiring) to transfer data signals DQ and data strobe signals DQS, and the control bus 1220 includes at least one of a command (CMD) line and/or address (ADD) line.

The data bus 1210 and control bus 1220 are directly connected to the buffer chip 1270 via the respective socket/pin and bus signal line arrangements. In turn, the buffer chip 1270 is connected to the respective memory chips 401*a*, . . . , 401*h* via at least a commonly-connected first bus 1230 and separately connected second buses 1240*a*, 1240*b*, 1240*c*, 1240*d*, 1240*e*, 1240*f*, 1240*g*, 1240*h* from specified ports of the buffer chip 1270 to corresponding ports of the memory chips 401*a*, . . . , 401*h*. The buffer chip 1270 may be used to transfer a received command and/or address received from the memory controller 200 via the control bus 1220 to the respective memory chips 401*a*, . . . , 401*h* via the first bus 1230.

The buffer chip 1270 may transfer write data DQ (i.e., data to be written to one or more of the memory chips 400*a*, . . . , 400*h*) and the data strobe signal DQS received from the memory controller 200 via the data bus 1210 to the memory chips 401*a*, . . . , 401*h* via the respective second buses 1240*a*, . . . , 1240*h*. Alternately, the buffer chip 1270 may transfer read data DQ (data retrieved from one or more of the memory chips 401*a*, . . . , 401*h*) obtained from one or more of the memory chips 401*a*, . . . , 401*h* via the second buses 1240*a*, . . . , 1240*h* to the memory controller 200 via the data bus 1210.

Each of the memory chips 401*a*, . . . , 401*h* may include a temperature measurement circuit TMMS 100 and an operation limit controller OLCON 300 as described above. The temperature measurement 100 may measure the operation temperature of the stacked memory device to generate the temperature code corresponding to the operation temperature. The operation limit controller 300 may, when it is determined based on the temperature code that the operation temperature exceeds a risk temperature, control an internal operation of the stacked memory device regardless of the command signals and the control signals transferred from the memory controller such that power consumption of the stacked memory device is decreased.

Figure 28:
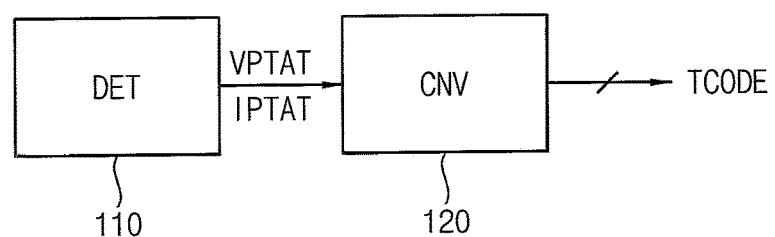
FIG. 28 is a block diagram illustrating an example embodiment of a temperature measurement circuit included in a semiconductor memory device according to example embodiments.
Figure 29:
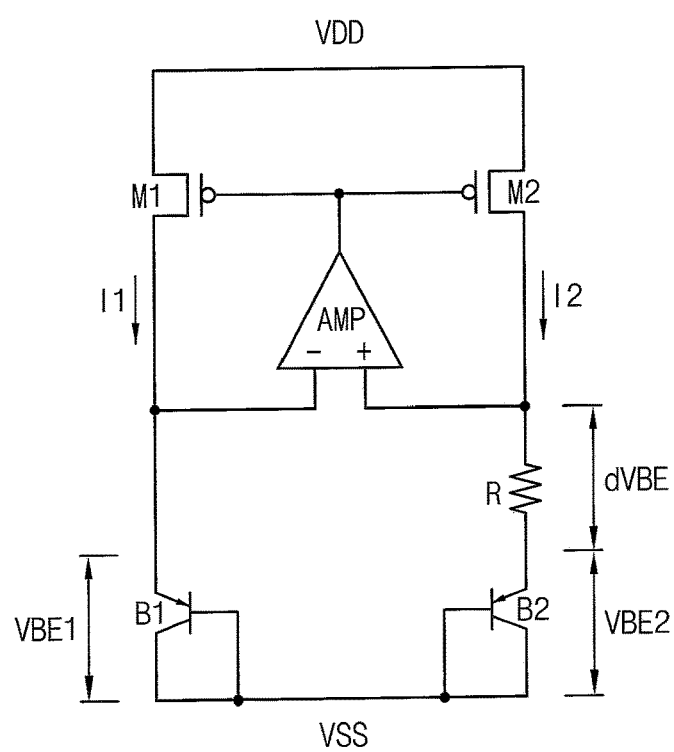
FIG. 29 is a circuit diagram illustrating an example embodiment of a temperature detector included in the temperature measurement circuit of FIG. 28.

FIG. 28 is a block diagram illustrating an example embodiment of a temperature measurement circuit included in a semiconductor memory device according to example embodiments, and FIG. 29 is a circuit diagram illustrating an example embodiment of a temperature detector included in the temperature measurement circuit of FIG. 28.

Referring to FIG. 28, a temperature measurement circuit 100 may include a temperature detector (DET) 110 and an analog-to-digital convertor (CNV) 120. The temperature detector 110 may output at least one of a voltage signal VPTAT and a current signal IPTAT proportional to the operation temperature To. The analog-to-digital converter 120 may convert the output of the temperature detector 110 to a digital signal to generate a temperature code TCODE of multiple bits.

In some example embodiments, the temperature detector 110 may be implemented with first and second PMOS transistors M1 (with current I1), M2 (with current I2), a feedback amplifier AMP, a resistor R and first and second bipolar transistors B1, B2, which are coupled between a power supply voltage VDD and a ground voltage VSS as represented in FIG. 29. A voltage dVBE across the resistor R may be obtained as Expression 1.

$$dVBE = VBE1 - VBE2 \quad \text{(Expression 1)}$$
$$= VT*Ln(Ic1/Is1) - VT*Ln(n*Ic2/Is2)$$
$$= VT*Ln(n)$$

In Expression 1, Is1 and Is2 indicate reverse saturation currents of the bipolar transistors B1, B2. Also, Ic1 and Ic2 indicate currents flowing through the bipolar transistors B1, B2. Additionally, n is a gain ratio of the bipolar transistors B1, B2, and VT indicates a temperature voltage that is proportional to an absolute temperature of the temperature detector 110. Ln(n) is a constant value and thus the voltage dVBE across the resistor R and the current I2 flowing through the resistor R are proportional to the temperature variation. The voltage signal VPTAT and the current signal IPTAT may be generated as an output based on the voltage dVBE and the current I2 proportional to the operational temperature.

The on-chip temperature sensor described with reference to FIGS. 28 and 29 may be integrated in the same semiconductor die of the semiconductor memory device, and the on-chip temperature sensor is distinct from an external temperature sensor such as a TSOD that is disposed at the memory module. Using the temperature measurement circuit 100 as described with reference to FIGS. 28 and 29, the operation temperature To of the semiconductor memory device may be measured accurately and a physical damage of the semiconductor memory device may be prevented.

Figure 30:
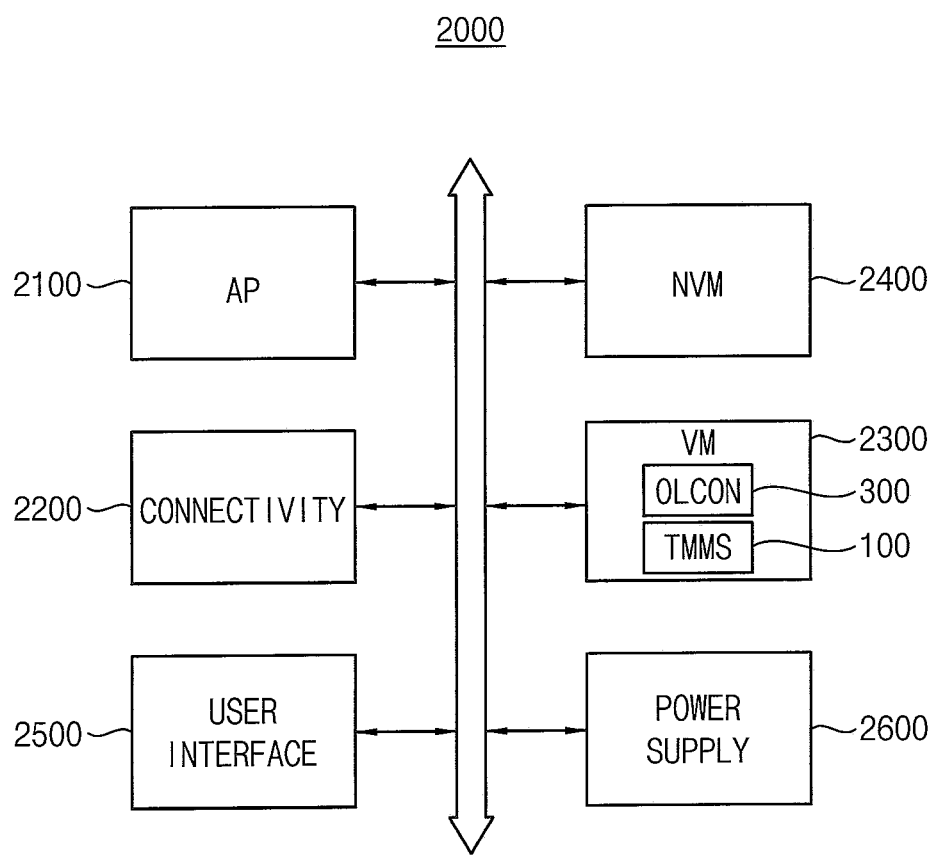
FIG. 30 is a block diagram illustrating a mobile system according to example embodiments.

FIG. 30 is a block diagram illustrating a mobile system according to example embodiments.

Referring to FIG. 30, a mobile system 2000 may include an application processor (AP) 2100, a connectivity unit 2200, a volatile memory device (VM) 2300, a nonvolatile memory device (NVM) 2040, a user interface 2500, and a power supply 2600. In some embodiments, the mobile system 2000 may be, for example, a mobile phone, a smart phone, a personal digital assistant (PDA), a portable multimedia player (PMP), a digital camera, a music player, a portable game console, a navigation system, or another type of electronic device.

The application processor 2100 may execute applications, e.g., a web browser, a game application, a video player, and so on. The connectivity unit 2200 may perform wired or wireless communication with an external device. The volatile memory device 2300 may store data processed by the application processor 2100 or may operate as a working memory. The nonvolatile memory device 2400 may store a boot image for booting the mobile system 2000. The user interface 2500 may include at least one input device, such as a keypad, a touch screen, etc., and at least one output device, such as a speaker, a display device, etc. The power supply 2600 may supply a power supply voltage to the mobile system 1200.

As described above, the volatile memory device 2300 may include a temperature measurement circuit TMMS 100 and an operation limit controller OLCON 300. The temperature measurement 100 may measure the operation temperature of the stacked memory device to generate the temperature code corresponding to the operation temperature. The operation limit controller 300 may, when it is determined based on the temperature code that the operation temperature exceeds a risk temperature, control an internal operation of the stacked memory device regardless of the command signals and the control signals transferred from the memory controller such that power consumption of the stacked memory device is decreased.

As described above, the semiconductor memory device, the memory system and the method according to example embodiments may efficiently prevent physical damage of the semiconductor memory device by controlling the internal operation of the semiconductor memory device based on the internal operation temperature of the semiconductor memory device regardless of control of the memory controller.

Embodiments described herein may be applied to any memory device and system included a memory device. For example, embodiments may be applied to systems such as a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

As described above, example embodiments may provide a memory device and a memory system capable of efficiently performing a hammer refresh operation. Example embodiments may provide a method of controlling refresh of a memory device capable of efficiently performing a hammer refresh operation.

What is claimed is:

1. A semiconductor memory device comprising:
   a plurality of input-output pins configured to communicate with a memory controller;
   a command control logic configured to control an operation of the semiconductor memory device based on command signals and control signals transferred from the memory controller through control pins among the plurality of input-output pins;
   a temperature measurement circuit configured to measure an operation temperature of the semiconductor memory device to generate a temperature code corresponding to the operation temperature; and
   an operation limit controller configured to, when it is determined based on the temperature code that the operation temperature exceeds a risk temperature, control an internal operation of the semiconductor memory device regardless of the command signals and the control signals transferred from the memory controller to thereby decrease a power consumption of the semiconductor memory device.

2. The semiconductor memory device of claim 1, wherein the operation limit controller is further configured to control the semiconductor memory device to enter a power down mode regardless of power down commands transferred from the memory controller, when the operation temperature exceeds the risk temperature.

3. The semiconductor memory device of claim 1, wherein the operation limit controller is further configured to reset the semiconductor memory device regardless of a reset signal transferred from the memory controller when the operation temperature exceeds the risk temperature.

4. The semiconductor memory device of claim 1, wherein the operation limit controller is further configured to transfer first data including errors to the memory controller regardless of read data when the operation temperature exceeds the risk temperature.

5. The semiconductor memory device of claim 1, wherein the operation limit controller is further configured to transfer operation limit information to the memory controller when the operation temperature exceeds the risk temperature.

6. The semiconductor memory device of claim 1, wherein the operation limit controller comprises:
   a comparison circuit configured to generate an operation limit signal based on an operation code; and
   a control signal generator configured to generate signals in response to activation of the operation limit signal to control the internal operation of the semiconductor memory device.

7. The semiconductor memory device of claim 6, wherein the comparison circuit is further configured to determine whether to activate the operation limit signal, in response to an enable signal that is activated periodically.

8. The semiconductor memory device of claim 7, wherein the comparison circuit is further configured to activate the operation limit signal at a time point when the operation temperature exceeds the risk temperature and deactivate the operation limit signal after an operation limit time that is fixed regardless of the operation temperature.

9. The semiconductor memory device of claim 6, wherein the comparison circuit is further configured to activate the operation limit signal at a first time point when the operation temperature exceeds the risk temperature and deactivate the operation limit signal at a second time point when the operation temperature decreases below the risk temperature.

10. The semiconductor memory device of claim 6, wherein the comparison circuit is further configured to activate the operation limit signal at a first time point when the operation temperature exceeds the risk temperature and deactivate the operation limit signal at a second time point when the operation temperature decreases below a limit end temperature that is lower than the risk temperature.

11. The semiconductor memory device of claim 6, wherein the operation limit controller is further configured to control the semiconductor memory device to enter a power down mode in response to activation of the operation limit signal and to exit from the power down mode in response to deactivation of the operation limit signal.

12. The semiconductor memory device of claim 1, further comprising:
   a selector configured to transfer a virtual clock enable signal and a virtual chip selection signal to the command control logic, in replacement of a clock enable signal and a chip selection signal that are transferred from the memory controller through the control pins,
   wherein the operation limit controller is further configured to generate the virtual clock enable signal and the virtual chip selection signal corresponding to power down commands, when the operation temperature exceeds the risk temperature.

13. The semiconductor memory device of claim 1, further comprising:
   a selector configured to transfer virtual command-address signals to the command control logic, in replacement of a portion of a plurality of command-address signals that are transferred from the memory controller through the control pins,
   wherein the operation limit controller is further configured to generate the virtual command-address signals corresponding to power down commands, when the operation temperature exceeds the risk temperature.

14. The semiconductor memory device of claim 1, further comprising:

a selector configured to transfer a virtual reset signal and a virtual chip selection signal to the command control logic, in replacement of a reset signal and a chip selection signal that are transferred from the memory controller through the control pins, wherein the operation limit controller is further configured to generate the virtual reset signal and the virtual chip selection signal corresponding to a reset operation, when the operation temperature exceeds the risk temperature.

15. The semiconductor memory device of claim 1, further comprising:

a data error generator configured to, in response to activation of an operation limit signal, pull down a portion of data pins to a ground voltage or pull up the portion of data pins to a power supply voltage, wherein the plurality of input-output pins comprises the portion of data pins, wherein the operation limit controller is further configured to activate the operation limit signal when the operation temperature exceeds the risk temperature.

16. The semiconductor memory device of claim 1, wherein the temperature measurement circuit comprises an on-chip temperature sensor that is provided in a semiconductor die of the semiconductor memory device.

17. A memory system comprising:
a memory controller; and
a semiconductor memory device comprising:
a plurality of input-output pins configured to communicate with the memory controller;
a command control logic configured to control an operation of the semiconductor memory device based on command signals and control signals transferred from the memory controller through control pins among the plurality of input-output pins;
a temperature measurement circuit configured to measure an operation temperature of the semiconductor memory device to generate a temperature code corresponding to the operation temperature; and an operation limit controller configured to, when it is determined based on the temperature code that the operation temperature exceeds a risk temperature, control an internal operation of the semiconductor memory device regardless of the command signals and the control signals transferred from the memory controller to thereby decrease a power consumption of the semiconductor memory device.

18. The memory system of claim 17, wherein the memory controller is configured to control a temperature throttling operation to adjust the operation temperature of the semiconductor memory device based on temperature information provided from an external temperature measurement circuit disposed outside the semiconductor memory device, and wherein the operation limit controller is further configured to control the internal operation of the semiconductor memory device based on the temperature code regardless of the temperature throttling operation.

19. The memory system of claim 17, wherein the operation limit controller is further configured to control the semiconductor memory device to enter a power down mode regardless of power down commands transferred from the memory controller, when the operation temperature exceeds the risk temperature.

20. A method of controlling a semiconductor memory device, the method comprising:

generating, by a temperature measurement circuit of the semiconductor memory device, a temperature code corresponding to an operation temperature of the semiconductor memory device by measuring the operation temperature; and determining, based on the temperature code, whether the operation temperature exceeds a risk temperature; and when the operation temperature exceeds the risk temperature, controlling an internal operation of the semiconductor memory device regardless of command signals and control signals transferred from a memory controller to thereby decrease a power consumption of the semiconductor memory device.

* * * * *